(12) United States Patent
Song et al.

(10) Patent No.: US 9,991,357 B2
(45) Date of Patent: Jun. 5, 2018

(54) SEMICONDUCTOR DEVICES WITH GATE ELECTRODES ON SEPARATE SETS OF HIGH-K DIELECTRIC LAYERS

(71) Applicant: Samsung Electronics Co., Ltd., Suwon-si, Gyeonggi-do (KR)

(72) Inventors: Jaeyeol Song, Seoul (KR); Wandon Kim, Yongin-si (KR); Hoonjoo Na, Hwaseong-si (KR); Suyoung Bae, Daegu (KR); Hyeok-Jun Son, Seoul (KR); Sangjin Hyun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 32 days.

(21) Appl. No.: 15/186,982

(22) Filed: Jun. 20, 2016

(65) Prior Publication Data

US 2017/0005175 A1 Jan. 5, 2017

(30) Foreign Application Priority Data

Jul. 2, 2015 (KR) ........................ 10-2015-0094788

(51) Int. Cl.
*H01L 27/088* (2006.01)
*H01L 29/51* (2006.01)
(Continued)

(52) U.S. Cl.
CPC ...... *H01L 29/517* (2013.01); *H01L 21/28185* (2013.01); *H01L 21/28194* (2013.01);
(Continued)

(58) Field of Classification Search
CPC .............. H01L 29/517; H01L 29/7831; H01L 29/42356; H01L 27/085; H01L 29/518;
(Continued)

(56) References Cited

U.S. PATENT DOCUMENTS

| 7,547,951 B2 | 6/2009 | Lim et al. |
| 7,947,547 B2 | 5/2011 | Kurahashi et al. |

(Continued)

FOREIGN PATENT DOCUMENTS

| JP | 2011-211133 | 10/2011 |
| JP | 5471491 | 4/2014 |
| KR | 10-1486425 | 1/2015 |

OTHER PUBLICATIONS

Huang, J. et al., "Device and Reliability Improvement of HfSiON+LaOx/Metal Gate Stacks for 22nm Node Application", IEDM 2008, Dec. 15-17, 2008, pp. 1-4.
(Continued)

*Primary Examiner* — Tan N Tran
(74) *Attorney, Agent, or Firm* — Harness, Dickey & Pierce, P.L.C.

(57) ABSTRACT

A semiconductor device includes a semiconductor substrate including multiple active regions having a common conductivity type and separate, respective gate electrodes on the separate active regions. Different high-k dielectric layers may be between the separate active regions and the respective gate electrodes on the active regions. Different quantities of high-k dielectric layers may be between the separate active regions and the respective gate electrodes on the active regions. The different high-k dielectric layers may include different work-function adjusting materials.

19 Claims, 20 Drawing Sheets

(51) Int. Cl.
  *H01L 27/085*   (2006.01)
  *H01L 21/28*    (2006.01)
  *H01L 29/49*    (2006.01)

(52) U.S. Cl.
  CPC ...... *H01L 21/28202* (2013.01); *H01L 27/085* (2013.01); *H01L 29/513* (2013.01); *H01L 29/518* (2013.01); *H01L 29/4966* (2013.01)

(58) Field of Classification Search
  CPC ............ H01L 29/513; H01L 21/28194; H01L 21/28185
  USPC ........................................ 257/401, 402, 406
  See application file for complete search history.

(56) References Cited

U.S. PATENT DOCUMENTS

| | | |
|---|---|---|
| 8,293,599 B2 | 10/2012 | Na et al. |
| 8,383,484 B2 | 2/2013 | Haneda |
| 8,536,005 B2 | 9/2013 | Maruyama et al. |
| 8,969,970 B2 | 3/2015 | Sato et al. |
| 2010/0184260 A1* | 7/2010 | Luo ................. H01L 21/823807 438/154 |
| 2011/0306171 A1 | 12/2011 | Lim et al. |
| 2012/0104506 A1* | 5/2012 | Wang ............. H01L 21/823842 257/369 |

OTHER PUBLICATIONS

Garros, X. et al., "*Guidelines to improve mobility performances and BTI reliability of advanced High-K/Metal gate stacks*", VLSI Technology Digest of Technical Papers 2008, Jun. 17-19, 2008, pp. 68-69.

* cited by examiner

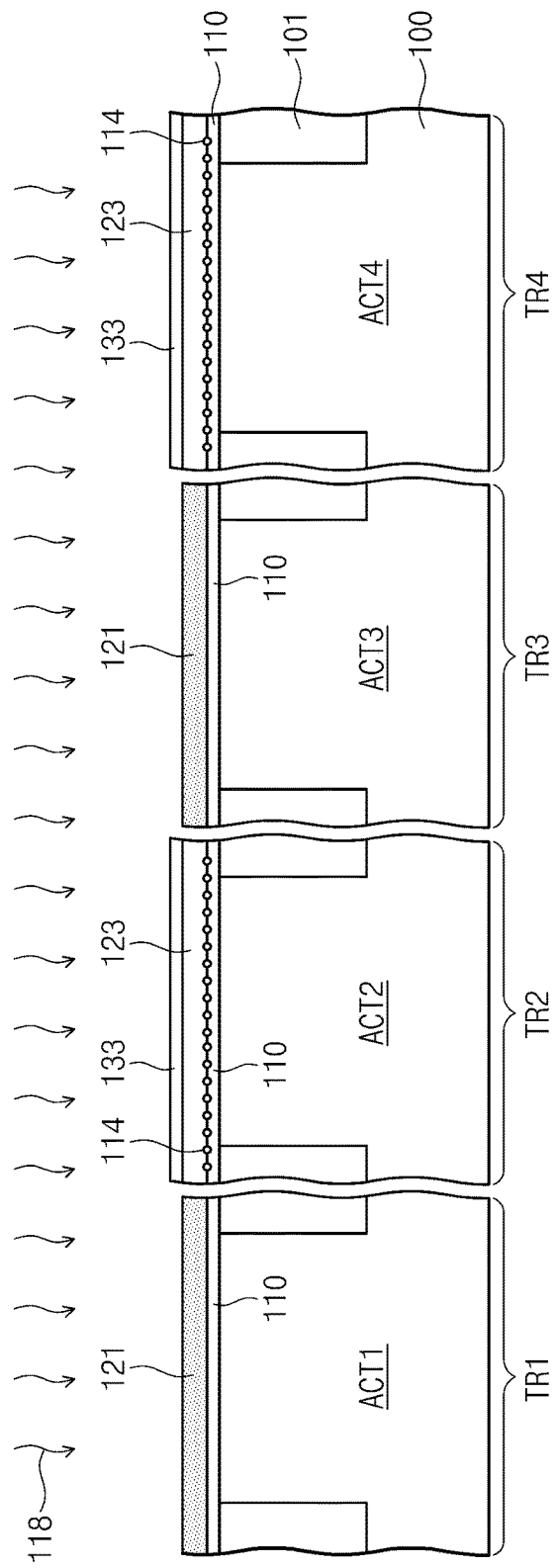

SEMICONDUCTOR DEVICES WITH GATE ELECTRODES ON SEPARATE SETS OF HIGH-K DIELECTRIC LAYERS

CROSS-REFERENCE TO RELATED APPLICATIONS

This U.S. non-provisional patent application claims priority under 35 U.S.C. § 119 to Korean Patent Application No. 10-2015-0094788, filed on Jul. 2, 2015, in the Korean Intellectual Property Office, the entire contents of which are hereby incorporated by reference.

BACKGROUND

Example embodiments of the inventive concepts relate to a semiconductor device and a method of fabricating the same, and in particular, to a semiconductor device in which field effect transistors with different threshold voltages are provided, and a method of fabricating the same.

A semiconductor device may include an integrated circuit (IC) comprising a plurality of metal oxide semiconductor field effect transistors (MOSFETs). Reducing the size and design rule of such a semiconductor device (i.e., increasing the degree of integration of the device) may include a scaling-down of MOS transistors. In some cases, such a scaling-down of MOS transistors may lead to degradation in operational characteristics of the semiconductor device.

SUMMARY

Example embodiments of the inventive concepts provide a semiconductor device with improved electric characteristics.

Other example embodiments of the inventive concepts provide a method of fabricating a semiconductor device with improved electric characteristics.

According to some example embodiments of the inventive concepts, a semiconductor device may include a semiconductor substrate including first and second active regions. The first and second active regions may have a common conductivity type. The semiconductor device may include a first gate electrode on the first active region, a first high-k dielectric layer between the first gate electrode and the semiconductor substrate, a second gate electrode on the second active region, a second high-k dielectric layer between the second gate electrode and the semiconductor substrate, and a third high-k dielectric layer between the second gate electrode and the second high-k dielectric layer. The first high-k dielectric layer may include a first work-function adjusting material, and the second and third high-k dielectric layers may include a second work-function adjusting material.

According to some example embodiments of the inventive concepts, a semiconductor device may include a semiconductor substrate including a first active region, a second active region, and a third active region, a first gate electrode on the first active region, a second gate electrode on the second active region, and a third gate electrode provided on the third active region, a separate first high-k dielectric layer between each of the first and third gate electrodes and the semiconductor substrate, and second and third high-k dielectric layers between the second gate electrode and the semiconductor substrate. The first high-k dielectric layer may include a first work-function adjusting material, and the second and third high-k dielectric layers may include a second work-function adjusting material. The first gate electrode and the second gate electrode may have substantially common effective work-functions, and the third gate electrode and the second gate electrode may have different effective work-functions.

According to some example embodiments of the inventive concepts, a method of fabricating a semiconductor device may include forming a lower high-k dielectric layer on a semiconductor substrate, the substrate including a first active region and a second active region, the first and second active regions having a common conductivity type. The method may include doping a first portion of the lower high-k dielectric layer with a first work-function adjusting material to form a first high-k dielectric layer on the first active region, the first portion of the lower high-k dielectric layer being on the first active region. The method may include forming an upper high-k dielectric layer on a second portion of the lower high-k dielectric layer, the second portion of the lower high-k dielectric layer being on the second active region, the upper high-k dielectric layer including a second work-function adjusting material. The method may include diffusing the second work-function adjusting material in the upper high-k dielectric layer into the second portion of the lower high-k dielectric layer to form a second high-k dielectric layer on the second active region. The method may include forming a metal layer to cover the first high-k dielectric layer on the first active region and the upper high-k dielectric layer on the second active region.

According to some example embodiments of the inventive concepts, a semiconductor device may include a semiconductor substrate, a first gate electrode, a first high-k dielectric layer, a second gate electrode, and a second high-k dielectric layer. The semiconductor substrate may include at least a first active region and a second active region. The first gate electrode may be on the first active region. The first high-k dielectric layer may be between the first gate electrode and the semiconductor substrate. The first high-k dielectric layer may include a first work-function adjusting material. The second gate electrode may be on the second active region. The second high-k dielectric layer may be between the second gate electrode and the semiconductor substrate. The second high-k dielectric layer may include a second work-function adjusting material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 10A, 10B, 10C, 10D, 10E, 10F, and 10G are sectional views illustrating a method of fabricating a semiconductor device, according to some example embodiments of the inventive concepts.

Figure 1:
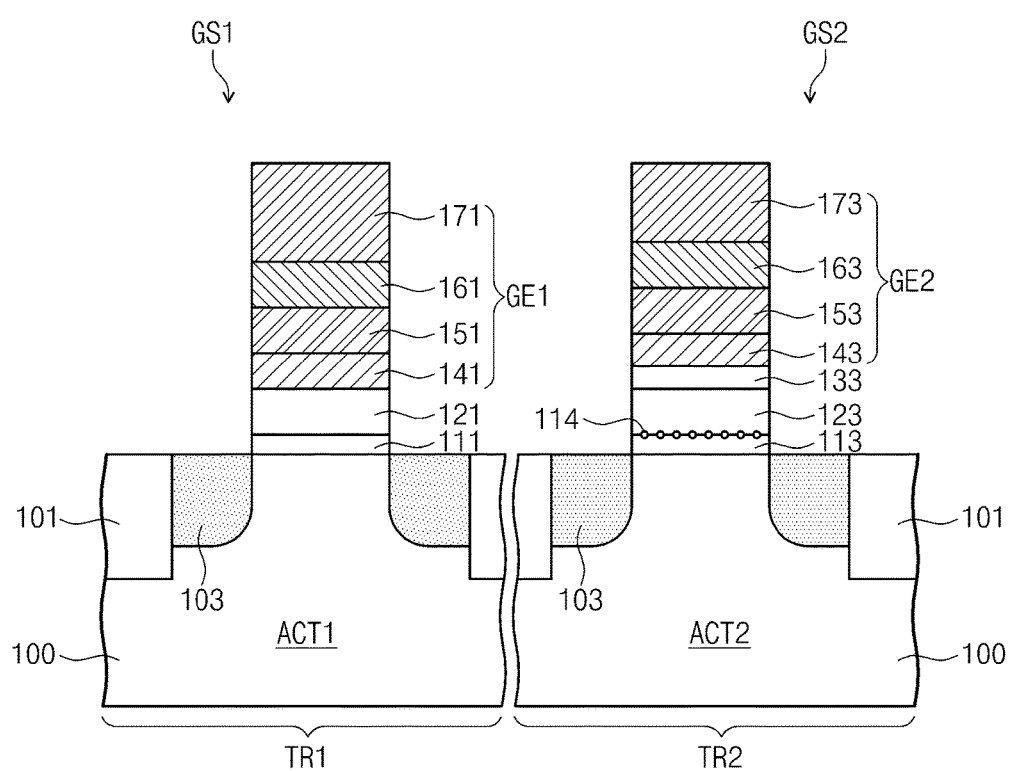
FIG. 1 is a sectional view illustrating a semiconductor device according to some example embodiments of the inventive concepts.

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion e.g., "between" versus "directly between," "adjacent" versus "directly adjacent," on versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the following description, an effective work function of a gate electrode is a parameter that is dependent on a material of the gate electrode and a method of forming the gate electrode and affects a threshold voltage of MOS field effect transistor. In addition, a work function of a specific material (e.g., a metal layer) is the minimum energy needed to remove an electron at a Fermi level from an atom in the material to a point in the vacuum and is an intrinsic property of the material.

Figure 2A:
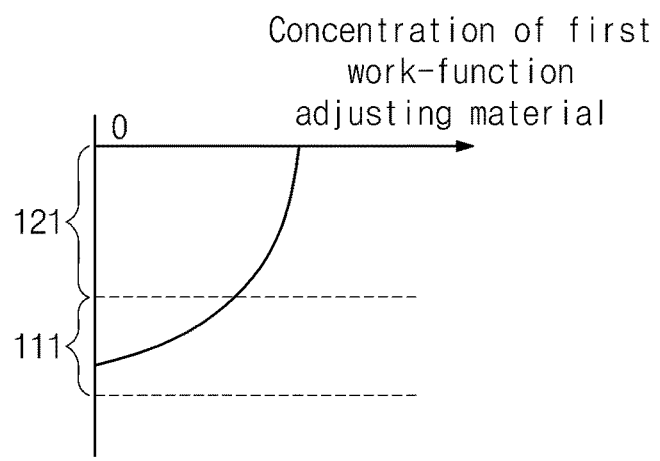
FIGS. 2A and 2B are graphs showing examples of a concentration distribution of a first work-function adjusting material in a portion of a semiconductor device according to some example embodiments of the inventive concepts.
Figure 2B:
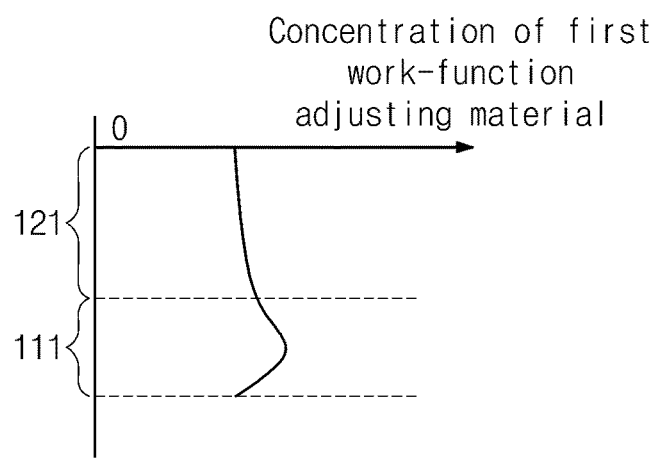
Figure 3A:
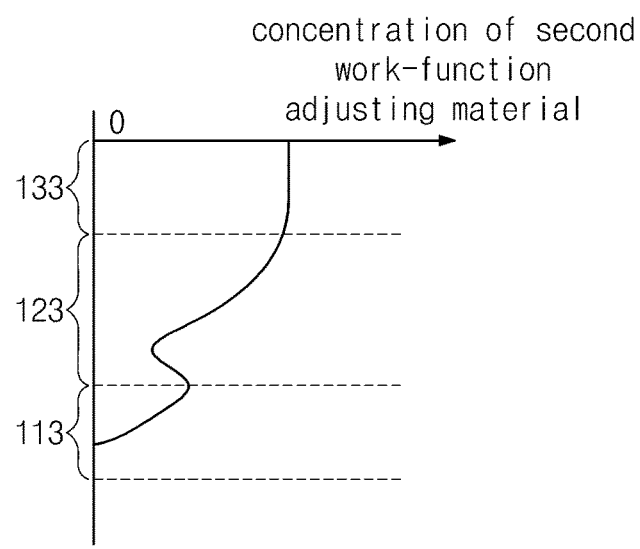
FIGS. 3A and 3B are graphs showing examples of a concentration distribution of a second work-function adjusting material in a portion of a semiconductor device according to some example embodiments of the inventive concepts.
Figure 3B:
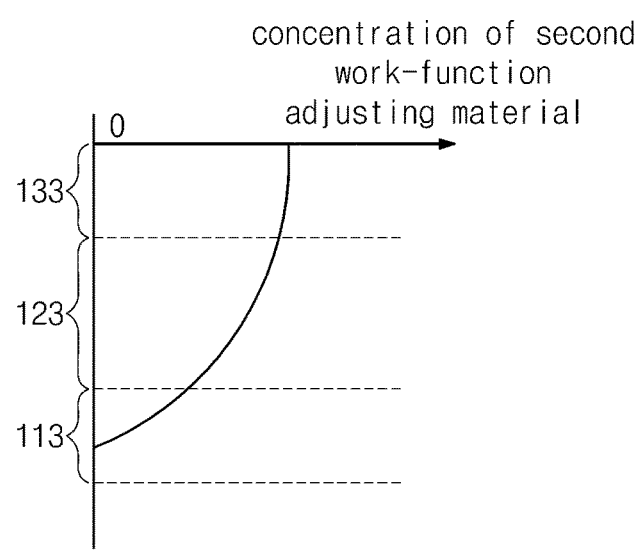

FIG. 1 is a sectional view illustrating a semiconductor device according to some example embodiments of the inventive concepts. FIGS. 2A and 2B are graphs showing examples of a concentration distribution of a first work-function adjusting material in a portion of a semiconductor device according to some example embodiments of the inventive concepts. FIGS. 3A and 3B are graphs showing examples of a concentration distribution of a second work-function adjusting material in a portion of a semiconductor device according to some example embodiments of the inventive concepts.

Referring to FIG. 1, a semiconductor device may include first and second MOS field effect transistors TR1 and TR2 (hereinafter, referred as to "first and second transistors") having the same conductivity type. The first and second transistors TR1 and TR2 may have threshold voltages different from each other. For example, the first transistor TR1 may have a first threshold voltage, and the second transistor TR2 may have a second threshold voltage lower than the first threshold voltage.

In detail, the first transistor TR1 may include a first gate structure GS1, which is provided on a semiconductor substrate 100, and source/drain electrodes 103, which are provided in the semiconductor substrate 100 and at both sides of the first gate structure GS1. The second transistor TR2 may include a second gate structure GS2, which is provided on the semiconductor substrate 100, and source/drain electrodes 103, which are provided in the semiconductor substrate 100 and at both sides of the second gate structure GS2.

The semiconductor substrate 100 may include first and second active regions ACT1 and ACT2 defined by a device isolation layer 101. In some example embodiments, the semiconductor substrate 100 may be a single crystalline silicon wafer. In some example embodiments, the semiconductor substrate 100 may be at least one of a silicon-on-insulator (SOI) wafer, a germanium wafer, a germanium-on-insulator (GOI) wafer, a silicon-germanium wafer, and a substrate including an epitaxial layer. The semiconductor substrate 100 may include an n-type or p-type well impurity layer, and in some example embodiments, the first and second active regions ACT1 and ACT2 may have the same conductivity type (a "common conductivity type").

The first gate structure GS1 may include a first gate electrode GE1 and a first interface layer 111 and a first high-k dielectric layer 121 interposed between the first gate electrode GE1 and the first active region ACT1.

The first interface layer 111 may be formed of a dielectric material, whose dielectric constant is less than 9. For example, the first interface layer 111 may be at least one of a silicon oxide layer and a silicon oxynitride layer. The first interface layer 111 may contribute to a reduction in a quantity of interface defects between the semiconductor substrate 100 and the first high-k dielectric layer 121.

The first high-k dielectric layer 121 may be formed of a high-k dielectric material, whose dielectric constant is higher than that of silicon oxide. The first high-k dielectric material 121 may be thicker than the first interface layer 111. For example, the first high-k dielectric layer 121 may be formed of or include at least one of metal oxides, metal silicates, or metal silicate nitrides. The metal oxides may include oxide materials containing metallic elements (e.g., hafnium (Hf), aluminum (Al), lanthanum (La), and zirconium (Zr)). For example, the metal oxide may include at least one of $HfO_2$, $Al_2O_3$, $La_2O_3$, and $ZrO_2$. The metal silicates may include silicate materials containing a metallic element (e.g., hafnium (Hf) or zirconium (Zr)). For example, the metal silicates may include at least one of hafnium silicate (HfSiO) and zirconium silicate (ZrSiO). The metal silicate nitrides may include a silicate material containing a metallic element (e.g., hafnium (Hf) or zirconium (Zr)). For example, the metal silicate nitrides may include at least one of hafnium silicon nitride (HfSiON) and zirconium silicate nitride (ZrSiON).

In some example embodiments, the first high-k dielectric layer 121 may include a first work-function adjusting material. The first work-function adjusting material may be selected from one or more materials capable of adjusting an effective work function of the first gate structure GS1 and consequently adjusting a threshold voltage of the first transistor TR1. In some example embodiments, the first work-function adjusting material may include a nonmetallic element (e.g., nitrogen (N), fluorine (F), or carbon (C)).

In some example embodiments, as shown in FIG. 2A, the first work-function adjusting material may have a concentration profile decreasing in a direction from a top surface to a bottom surface of the first high-k dielectric layer 121. Such a direction may also be referred to as a direction through the first high-k dielectric layer 121 towards the first active region ACT1 of the semiconductor substrate 100. In some example embodiments, the concentration of the first work-function adjusting material may be substantially uniform in the first high-k dielectric layer 121. The first work-function adjusting material may exist in the first interface layer 111, and the concentration of the first work-function adjusting material may be lower in the first interface layer 111 than in the first high-k dielectric layer 121. In some example embodiments, where the concentration of the first work-function adjusting material is lower in the first interface layer 111 than in the first high-k dielectric layer 121, the first work-function adjusting material may increase the effective work function of the first gate structure GS1.

In some example embodiments, the first high-k dielectric layer 121 and the first interface layer 111 may contain the first work-function adjusting material. The concentration of the first work-function adjusting material may be higher in the first interface layer 111 than in the first high-k dielectric layer 121, as shown in FIG. 2B. In this case, the first work-function adjusting material may reduce the effective work function of the first gate structure GS1.

The first gate electrode GE1 may include a blocking layer 141, a work-function conductive layer 151, a barrier metal layer 161, and a metal layer 171, which are sequentially stacked on the first high-k dielectric layer 121.

In the first gate electrode GE1, the blocking layer 141 may make it possible to adjust an amount of metallic elements diffusing from the work-function conductive layer 151 to the first high-k dielectric layer 121. The effective work function of the first gate electrode GE1 may vary depending on a thickness of the blocking layer 141. The blocking layer 141 may be formed of or include at least one of titanium, tantalum, titanium nitride, tantalum nitride, titanium silicide, tantalum silicide, titanium carbide, tantalum carbide, titanium silicon nitride, tantalum silicon nitride, titanium silicon carbide, or tantalum silicon carbide. In some example embodiments, the blocking layer 141 may be formed of a titanium nitride (TiN) layer or a tantalum nitride (TaN) layer.

The work function conductive layer 151 may be formed of a conductive material with a specific work function, and the work function of the work function conductive layer 151 may be changed depending on the conductivity types of the first and second active regions ACT1 and ACT2. For example, in the case where the first and second active regions ACT1 and ACT2 are of p-type, the work-function conductive layer 151 may be formed of an n-type work-function material. In some example embodiments, where the first and second active regions ACT1 and ACT2 are of n-type, the work-function conductive layer 151 may be formed of a p-type work-function material. As an example, in the case where the first and second transistors TR1 and TR2 are n-type transistors, the work-function conductive layer 151 may be formed of a metallic material whose work function ranges from about 3.9 eV to about 4.4 eV. As another example, in the case where the first and second transistors TR1 and TR2 are p-type transistors, the work-function conductive layer 151 may be formed of a metallic material whose work function ranges from about 4.7 eV to about 5.2 eV.

In some example embodiments, the work-function conductive layer 151 may be formed of an aluminum-containing conductive material. For example, the work-function conductive layer 151 may be formed of at least one of metal aluminide, metal aluminum carbide, metal aluminum nitride, and metal aluminum silicide. In some example embodiments, the work-function conductive layer 151 may be formed of at least one of metal nitride materials, such as titanium nitride, tantalum nitride, tungsten nitride, hafnium nitride, and zirconium nitride.

The barrier metal layer 161 may prevent metallic elements in the metal layer 171 from being diffused into the work-function conductive layer 151. For example, the barrier metal layer 161 may be formed of or include at least one of metals (e.g., tungsten, aluminum, titanium, and/or tantalum) or conductive metal nitrides (e.g., titanium nitride, tantalum nitride, and/or tungsten nitride).

The metal layer 171 may be formed of at least one of metallic materials whose resistivity is lower than that of the barrier metal layer 161. For example, the metal layer 171 may be formed of at least one of tungsten, copper, hafnium, zirconium, titanium, tantalum, aluminum, ruthenium, palladium, platinum, cobalt, nickel, and conductive metal nitrides.

The second gate structure GS2 may include a second gate electrode GE2 and a second interface layer 113, a second high-k dielectric layer 123, and a third high-k dielectric layer 133, which are stacked between the second gate electrode GE2 and the second active region ACT2.

The second interface layer 113 may be formed of a dielectric material, whose dielectric constant is less than 9. For example, the second interface layer 113 may be a silicon oxide layer or a silicon oxynitride layer. The second interface layer 113 may contribute to a reduction in a quantity of interface defects between the semiconductor substrate 100 and the second high-k dielectric layer 123. In some example embodiments, the second interface layer 113 may have a substantially common thickness as the first interface layer 111 and may be formed of a common material as the first interface layer 111. In some example embodiments, the second interface layer 113 may have a chemical composition different from that of the first interface layer 111. For example, a nitrogen concentration of the second interface layer 113 may be lower than that of the first interface layer 111.

The second high-k dielectric layer 123 may be formed of a high-k dielectric material, whose dielectric constant is higher than that of silicon oxide. The second high-k dielectric material 123 may be thicker than the second interface layer 113. The second high-k dielectric layer 123 may have substantially the same thickness as the first high-k dielectric layer 121 and may be formed of the same metal material as the first high-k dielectric layer 121. For example, the second high-k dielectric layer 123 may contain a metallic element (e.g., hafnium (Hf), aluminum (Al), lanthanum (La), or zirconium (Zr)). The second high-k dielectric layer 123 may be formed of at least one of metal oxides, metal silicates, or metal silicate nitrides. In the case where the second high-k dielectric layer 123 includes a metal oxide layer, the second high-k dielectric layer 123 may be formed of or include at least one of $HfO_2$, $Al2O_3$, $La_2O_3$, and $ZrO_2$.

The third high-k dielectric layer 133 may be formed of a high-k dielectric material different from that of the second high-k dielectric layer 123 and may be thinner than the second high-k dielectric layer 123.

In some example embodiments, at least one of the second and third high-k dielectric layers 123 and 133 may contain a second work-function adjusting material. In some example embodiments, the second work-function adjusting material may be a metallic material and may have electronegativity lower than that of the first work-function adjusting material in the first high-k dielectric layer 121. The second work-function adjusting material may be a metallic material, whose electron affinity is different from the metallic material contained in the second high-k dielectric layer 123. For example, the second work-function adjusting material may include Al, Mg, Ca, Sr, V, Nb, Sc, Y, lanthanoid materials, or combinations thereof. In the case where the second transistor TR2 is of n-type, the third high-k dielectric layer 133 may be lanthanum oxide. In the case where the second transistor TR2 is of p-type, the third high-k dielectric layer 133 may be aluminum oxide.

Owing to the presence of the second work-function adjusting material, dipoles 114 may be formed at the interface between the second high-k dielectric layer 123 and the second interface layer 113. The presence of the dipoles 114 may result in a change in effective work-function, and consequently threshold voltage, of the second transistor TR2. A concentration of the second work-function adjusting material may be lower in the second high-k dielectric layer 123 than in the third high-k dielectric layer 133. The concentration of the second work-function adjusting material in the second high-k dielectric layer 123 may be greater than the concentration of the first work-function adjusting material in the first high-k dielectric layer 121.

In detail, referring to FIG. 3A, the concentration of the second work-function adjusting material may decrease in a direction from a top surface to a bottom surface of the second high-k dielectric layer 123. Such a direction may also be referred to as a direction through the second high-k dielectric layer 123 towards the second active region ACT2 of the semiconductor substrate 100. Furthermore, as a result of the presence of the dipoles 114, the second work-function adjusting material may be piled up, or accumulated, at the interface between the second high-k dielectric layer 123 and the second interface layer 113. Accordingly, as shown in FIG. 3A, the concentration of the second work-function adjusting material may have a local maximum at the interface between the second interface layer 113 and the second high-k dielectric layer 123. In some example embodiments, the second work-function adjusting material may have a concentration profile continuously decreasing in a direction from the third high-k dielectric layer 133 to the second interface layer 113, as shown in FIG. 3B.

Similar to the first gate electrode GE1, the second gate electrode GE2 may include a blocking layer 143, a work-function conductive layer 153, a barrier metal layer 163, and a metal layer 173. In some example embodiments, the blocking layer, the work-function conductive layer, and the metal layer may be provided may be provided in such a way that there is no difference in materials and thicknesses thereof between the first and second gate electrodes GE1 and GE2. In other words, the second gate electrode GE2 may have substantially the same effective work-function as the first gate electrode GE1.

Figure 4:
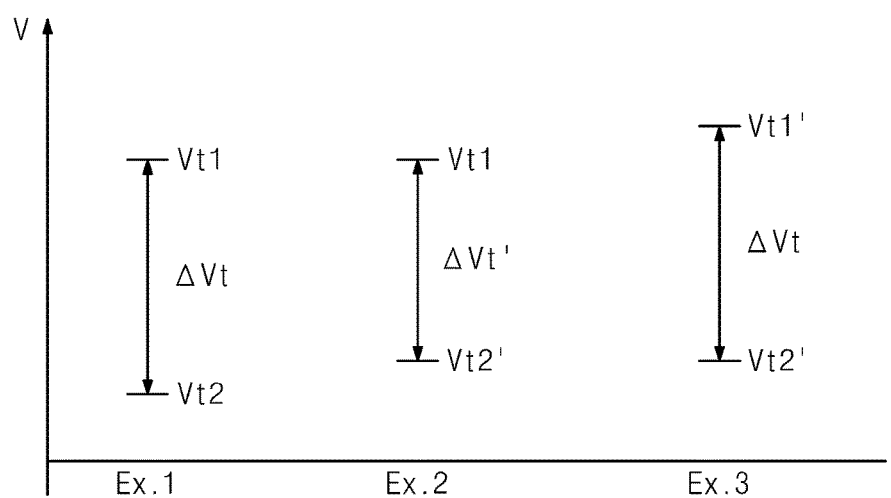
FIG. 4 is a graph showing a threshold voltage level of a semiconductor device according to some example embodiments of the inventive concepts.

FIG. 4 is a graph showing a threshold voltage level of a semiconductor device according to some example embodiments of the inventive concepts.

Referring to FIGS. 1 and 4, the effective work-function of the first gate structure GS1 may be controlled by a concentration of the first work-function adjusting material contained in the first high-k dielectric layer 121, and this may make it possible to adjust the first threshold voltage Vt1 of the first transistor TR1. Also, the effective work-function of the second gate structure GS2 may be controlled by a concentration of the second work-function adjusting material contained in the second high-k dielectric layer 123, and this may also make it possible to adjust the second threshold voltage Vt2 of the second transistor TR2.

For example, if the first and second transistors TR1 and TR2 are of n-type, the concentration of the first work-function adjusting material contained in the first high-k dielectric layer 121 and the concentration of the second work-function adjusting material contained in the second high-k dielectric layer 123 may be classified as shown in the following Table 1.

TABLE 1

| | Concentration of first work-function adjusting material | Concentration of second work-function adjusting material |
|---|---|---|
| Ex. 1 | A1 | B1 |
| Ex. 2 | A1 | B2 (<B1) |
| Ex. 3 | A2 (>A1) | B2 |

In a first example (Ex. 1), the first threshold voltage may be Vt1, when the first work-function adjusting material contained in the first high-k dielectric layer 121 has a first concentration A1. The second threshold voltage may be Vt2, when the concentration of the second work-function adjusting material in the second high-k dielectric layer 123 has a second concentration B1. That is, in the first example, a difference in threshold voltage between the first and second transistors TR1 and TR2 may be ΔVt.

In a second example (Ex. 2), the concentration of the second work-function adjusting material in the second high-k dielectric layer 123 may be decreased. That is, in the second example, the first work-function adjusting material may have the first concentration A1, whereas the second work-function adjusting material may have a third concentration B2 lower than the second concentration B1. If the concentration of the second work-function adjusting material is decreased like this, the second threshold voltage of the second transistor TR2 may be increased to Vt2'. Accordingly, the difference in threshold voltage between the first and second transistors TR1 and TR2 may be decreased to ΔVt'.

In a third example (Ex. 3), the concentration of the first work-function adjusting material contained in the first high-k dielectric layer 121 may have a fourth concentration A2 higher than the first concentration A1. The concentration of the second work-function adjusting material in the second high-k dielectric layer 123 may have the third concentration B2 lower than the second concentration B1. If the concentration of the first work-function adjusting material is increased like this, the first threshold voltage of the first transistor TR1 may be increased to Vt1'. That is, in the case that the second threshold voltage is increased to Vt2' by the reduction in concentration of the second work-function adjusting material, by increasing the concentration of the first work-function adjusting material, it is possible to modulate or adjust the first threshold voltage by the change in the second threshold voltage (i.e., Vt2'–Vt2). As a result, by decreasing the concentration of the second work-function adjusting material, it is possible to reduce the quantity of defects at the interface between the second interface layer 113 and the semiconductor substrate 100 and to secure the difference in threshold voltage between the first and second transistors TR1 and TR2 (i.e., ΔVt).

In some example embodiments, when the concentration of the first work-function adjusting material of the first high-k dielectric layer 121 is increased, the first threshold voltage is increased. In some example embodiments, the concentration of the first work-function adjusting material in the first gate structure GS1 may be controlled to reduce the first threshold voltage. In some example embodiments, when the concentration of the second work-function adjusting material in the second high-k dielectric layer 123 is decreased, the second threshold voltage is increased. In some example embodiments, the concentration of the second work-function adjusting material in the second gate structure GS2 may be controlled to reduce the second threshold voltage.

Figure 5:
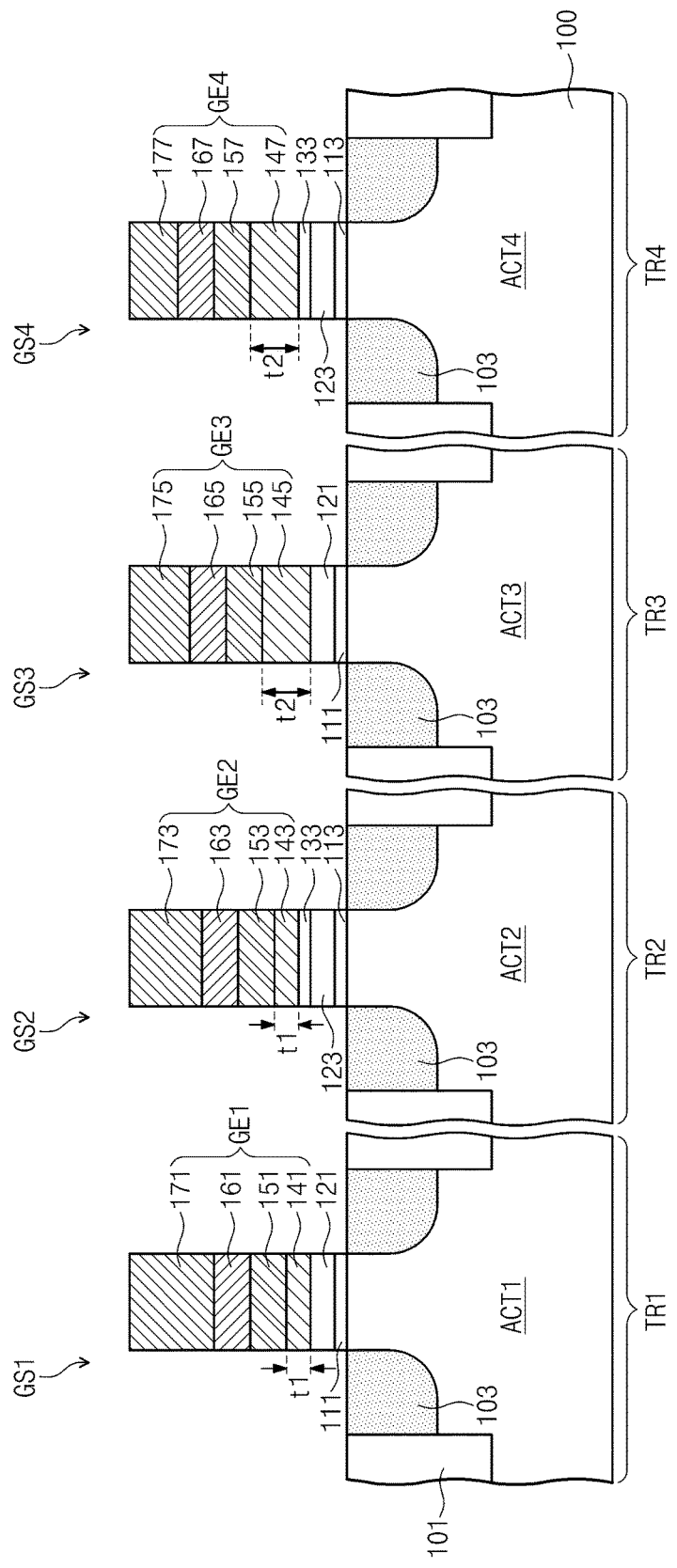
FIG. 5 is a sectional view illustrating a semiconductor device according to other example embodiments of the inventive concepts.

FIG. 5 is a sectional view illustrating a semiconductor device according to some example embodiments of the inventive concepts.

Referring to FIG. 5, a semiconductor device may include first to fourth transistors TR1, TR2, TR3, and TR4, which are of the same conductivity type and have different threshold voltages from each other. In some example embodiments, the first transistor TR1 may have a first threshold voltage, and the second transistor TR2 may have a second threshold voltage lower than that of the first threshold voltage. In some example embodiments, the third transistor TR3 may have a third threshold voltage higher than that of the first threshold voltage, and the fourth transistor TR4 may have a fourth threshold voltage, which is higher than that of the first threshold voltage and is lower than that of the third threshold voltage.

The first to fourth transistors TR1, TR2, TR3, and TR4 may include first to fourth gate structures GS1, GS2, GS3, and GS4, respectively, and each of the gate structures may have source/drain electrodes 103.

The semiconductor substrate 100 may include first to fourth active regions ACT1, ACT2, ACT3, and ACT4 defined by the device isolation layer 101, and the first to fourth gate structures GS1, GS2, GS3, and GS4 may be respectively disposed on the first to fourth active regions ACT1, ACT2, ACT3, and ACT4. In some example embodiments, the first to fourth active regions ACT1, ACT2, ACT3, and ACT4 may have the same conductivity type.

In some example embodiments, the first gate structure GS1 may include the first gate electrode GE1 and the first interface layer 111 and the first high-k dielectric layer 121 interposed between the first gate electrode GE1 and the first active region ACT1. The second gate structure GS2 may include the second gate electrode GE2 and the second interface layer 113, the second high-k dielectric layer 123, and the third high-k dielectric layer 133, which are stacked between the second gate electrode GE2 and the second active region ACT2. The third gate structure GS3 may include a third gate electrode GE3 and the first interface layer 111 and the first high-k dielectric layer 121, which are stacked between the third gate electrode GE3 and the third active region ACT3. The fourth gate structure GS4 may include a fourth gate electrode GE4 and the second interface layer 113, the second high-k dielectric layer 123, and the third high-k dielectric layer 133, which are stacked between the fourth gate electrode GE4 and the fourth active region ACT4.

In some example embodiments, the first gate electrode GE1 may have substantially the same effective work-function as the second gate electrode GE2, and the third gate electrode GE3 may have substantially the same effective work-function as the fourth gate electrode GE4. Here, the effective work-function of the first gate electrode GE1 may be different from that of the third gate electrode GE3.

In detail, the first interface layer 111 may be disposed on the first and third active regions ACT1 and ACT3, and the second interface layer 113 may be disposed on the second and fourth active regions ACT2 and ACT4. The first and second interface layers 111 and 113 may be formed of a dielectric material, whose dielectric constant is less than 9. For example, the first and second interface layers 111 and 113 may be a silicon oxide layer or a silicon oxynitride layer. The use of the first and second interface layers 111 and 113 may contribute to reduce the quantity of interface defects between the semiconductor substrate 100 and the first and second high-k dielectric layers 121 and 123. The first and second interface layers 113 may be formed of the same material. Alternatively, the second interface layer 113 may have a chemical composition different from that of the first interface layer 111. For example, a nitrogen concentration of the second interface layer 113 may be lower than that of the first interface layer 111. In some example embodiments, the first interface layer 111 may be formed of a silicon oxynitride layer, and the second interface layer 113 may be formed of a silicon oxide layer. In some example embodiments, the first and second interface layers 111 and 113 may be formed of a silicon oxynitride layer, and the nitrogen concentration of the second interface layer 113 may be lower than that of the first interface layer 111.

The first high-k dielectric layer 121 may be formed of a high-k dielectric material, whose dielectric constant is higher than that of silicon oxide, and may be thicker than the first interface layer 111. For example, the first high-k dielectric layer 121 may formed of or include at least one of metal oxides, metal silicates, or metal silicate nitrides. The metal oxides may include oxide materials containing metallic elements (e.g., hafnium (Hf), aluminum (Al), lanthanum (La), and zirconium (Zr)).

The first high-k dielectric layers 121 of the first and third gate structures GS1 and GS3 may include a first work-function adjusting material. The first work-function adjusting material may be selected from materials capable of adjusting effective work functions of the first and third gate structures GS1 and GS3 and consequently adjusting threshold voltages of the first and third transistors TR3. For example, the first work-function adjusting material may include a nonmetallic element (e.g., nitrogen (N), fluorine (F), or carbon (C)).

The first high-k dielectric layers 121 of the first and third gate structures GS1 and GS3 may be provided to have no difference in concentration profile of the first work-function adjusting material. In some example embodiments, the first work-function adjusting material may exist in the first interface layer 111, and as described with reference to FIG. 2A, the concentration of the first work-function adjusting material may be lower in the first interface layer 111 than in the first high-k dielectric layer 121. In some example embodiments, the concentration of the first work-function adjusting material may be higher in the first interface layer 111 than in the first high-k dielectric layer 121, as described with reference to FIG. 2B.

The second high-k dielectric layer 123 may be formed of a high-k dielectric material, whose dielectric constant is higher than that of silicon oxide, and may be thicker than the second interface layer 113. The second high-k dielectric layer 123 may have substantially the same thickness as the first high-k dielectric layer 121 and may be formed of the same metal material as the first high-k dielectric layer 121. For example, the second high-k dielectric layer 123 may contain a metallic element hafnium (Hf), aluminum (Al), lanthanum (La) or zirconium (Zr)). The second high-k dielectric layer 123 may be formed of at least one of metal oxides, metal silicates, or metal silicate nitrides. In the case where the second high-k dielectric layer 123 includes a metal oxide layer, the second high-k dielectric layer 123 may be formed of or include at least one of $HfO_2$, $Al_2O_3$, $La_2O_3$, and $ZrO_2$. The third high-k dielectric layer 133 may be formed of a high-k dielectric material different from that of the second high-k dielectric layer 123 and may be thinner than the second high-k dielectric layer 123.

In the second and fourth gate structures GS2 and GS4, each of the second and third high-k dielectric layers 123 and 133 may include a second work-function adjusting material. The second work-function adjusting material may be selected from materials capable of adjusting effective work functions of the second and fourth gate structures GS2 and GS4 and consequently adjusting threshold voltages of the second and fourth transistors TR4. The second work-function adjusting material may be a metallic material and may have electronegativity lower than that of the first work-function adjusting material in the first high-k dielectric layer 121. The second work-function adjusting material may be a metallic material, whose electron affinity is different from the metallic material contained in the second high-k dielectric layer 123.

The concentration of the second work-function adjusting material may be lower in the second high-k dielectric layer 123 than in the third high-k dielectric layer 133. The concentration of the second work-function adjusting material in the second high-k dielectric layer 123 may be greater than that of the first work-function adjusting material in the first high-k dielectric layer 121. In some example embodiments, the second and fourth gate structures GS2 and GS4 may have substantially the same concentration profile of the second work-function adjusting material. For example, the second work-function adjusting material may include at least one of Al, Mg, Ca, Sr, V. Nb, Sc, Y, and lanthanoid materials.

In some example embodiments, each of the first and third gate electrodes GE1 and GE3 may include a blocking layer 141 or 145, a work-function conductive layer 151 or 155, a barrier metal layer 161 or 165, and a metal layer 171 or 175, which are sequentially stacked on the first high-k dielectric layer 121. Each of the second and fourth gate electrodes GE2 and GE4 may also include a blocking layer 143 or 147, a work-function conductive layer 153 or 157, a barrier metal layer 163 or 167, and a metal layer 173 or 177, which are sequentially stacked on the third high-k dielectric layer 133.

In some example embodiments, the blocking layers 141, 143, 145, and 147 of the first to fourth gate electrodes GE1, GE2, GE3, and GE4 may be formed of the same material. Here, the blocking layers 141 and 143 of the first and second gate electrodes GE1 and GE2 may have substantially the same thickness of t1. The blocking layers 145 and 147 of the third and fourth gate electrodes GE3 and GE4 may have substantially the same thickness of t2, but the thickness t2 may be greater than the thickness t1 of the blocking layers 141 and 143. The blocking layers 141, 143, 145, and 147 may be formed of or include at least one of titanium, tantalum, titanium nitride, tantalum nitride, titanium silicide, tantalum silicide, titanium carbide, tantalum carbide, titanium silicon nitride, tantalum silicon nitride, titanium silicon carbide, or tantalum silicon carbide. In some example embodiments, the blocking layers 141, 143, 145, and 147 may be formed of a titanium nitride (TiN) layer or a tantalum nitride (TaN) layer.

The work-function conductive layers 151, 153, 155, and 157 of the first to fourth gate electrodes GE1, GE2, GE3, and GE4 may be formed of the same material and may have substantially the same thickness. The work-function conductive layers 151, 153, 155, and 157 may be formed of a conductive material with a specific work function, and the work function of the work function conductive layer 151 may be changed depending on the conductivity types of the first to fourth active regions ACT1, ACT2, ACT3, and ACT4. In some example embodiments, the work-function conductive layers 151, 153, 155, and 157 may be formed of an aluminum-containing conductive material. For example, the work-function conductive layers 151, 153, 155, and 157 may be formed of at least one of metal aluminide, metal aluminum carbide, metal aluminum nitride, and metal aluminum silicide. In some example embodiments, the work-function conductive layers 151, 153, 155, and 157 may be formed of at least one of metal nitride materials, such as titanium nitride, tantalum nitride, tungsten nitride, hafnium nitride, and zirconium nitride.

The barrier metal layers 161, 163, 166, and 167 of the first to fourth gate electrodes GE1, GE2, GE3, and GE4 may be formed of the same material and may have substantially the same thickness. In some example embodiments, the barrier metal layers 161, 163, 166, and 167 may be formed of or include at least one of metals (e.g., tungsten, aluminum, titanium, and/or tantalum) or conductive metal nitrides titanium nitride, tantalum nitride, and/or tungsten nitride).

The metal layers 171, 173, 175, and 177 of the first to fourth gate electrodes GE1, GE2, GE3, and GE4 may be formed of the same material. The metal layers 171 and 173 of the first and second gate electrodes GE1 and GE2 may have substantially the same thickness. The metal layers 175 and 177 of the third and fourth gate electrodes GE3 and GE4 may have substantially the same thickness and may be thinner than the metal layers 171 and 173 of the first and second gate electrodes GE1 and GE2. Alternatively, the metal layers 171, 173, 175, and 177 of the first to fourth gate electrodes GE1, GE2, GE3, and GE4 may have substantially the same thickness. The metal layers 171, 173, 175, and 177 may be formed of one of tungsten, copper, hafnium, zirconium, titanium, tantalum, aluminum, ruthenium, palladium, platinum, cobalt, nickel, and conductive metal nitrides or combinations thereof.

Figure 6:
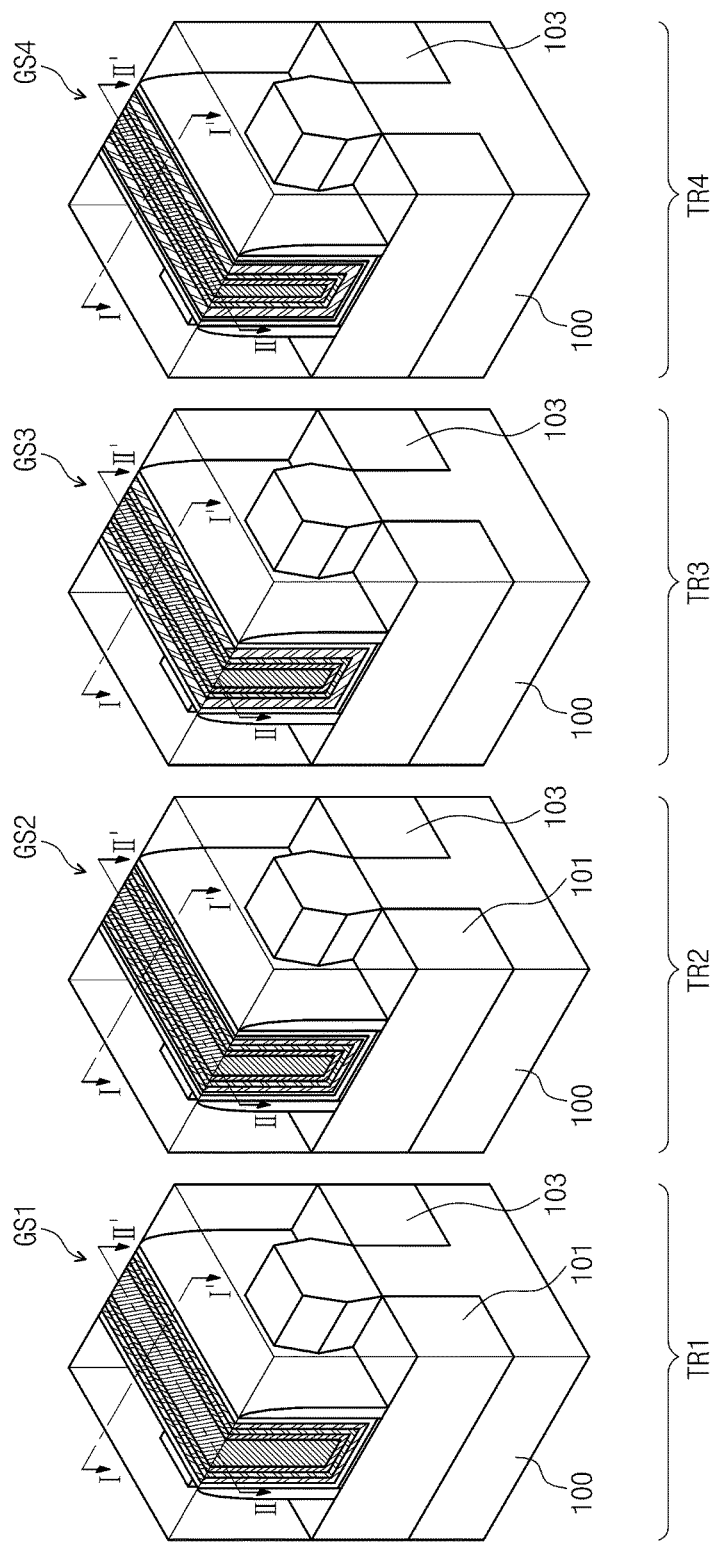
FIG. 6 is a perspective view illustrating a semiconductor device according to still other example embodiments of the inventive concepts.
Figure 7:
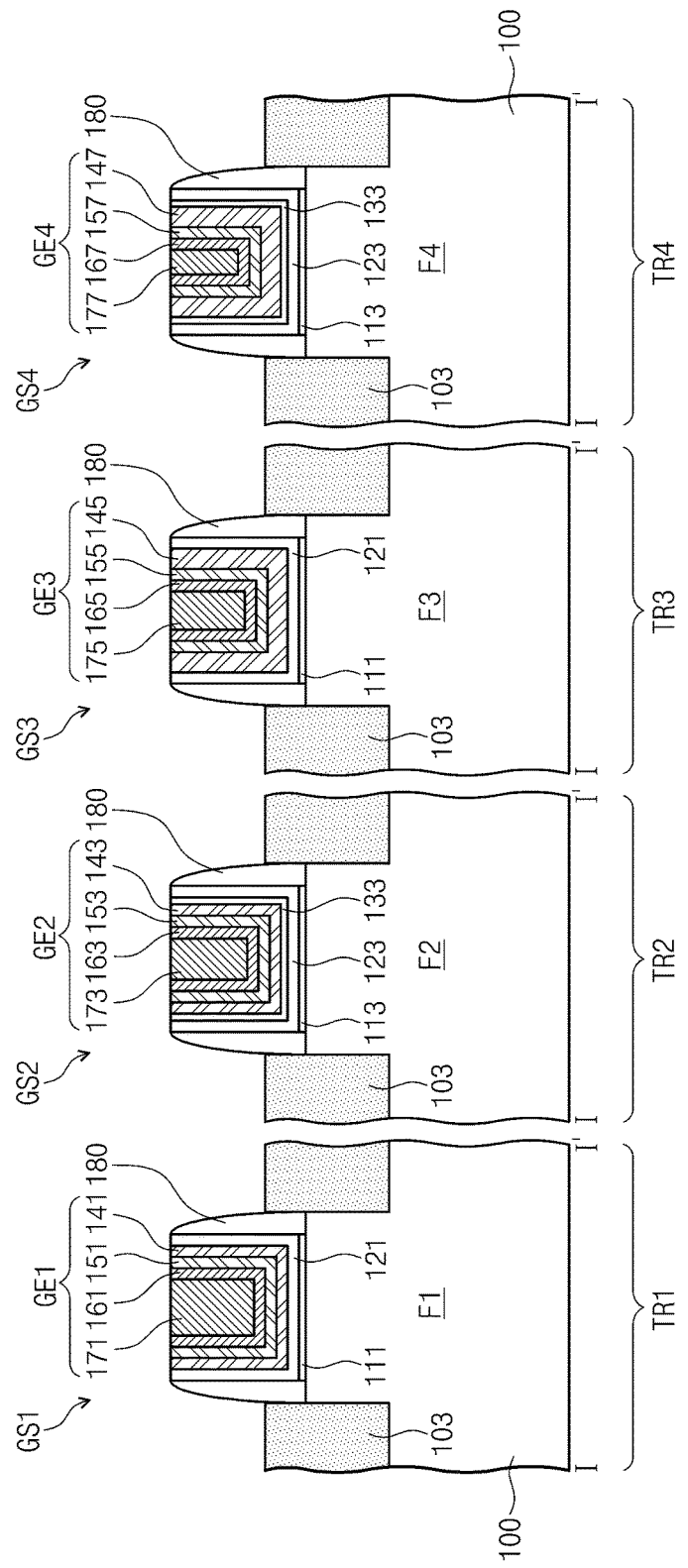
FIGS. 7 and 8 are sectional views taken along lines I-I' and II-II' of FIG. 6, to illustrate a semiconductor device according to still other example embodiments of the inventive concepts.
Figure 8:
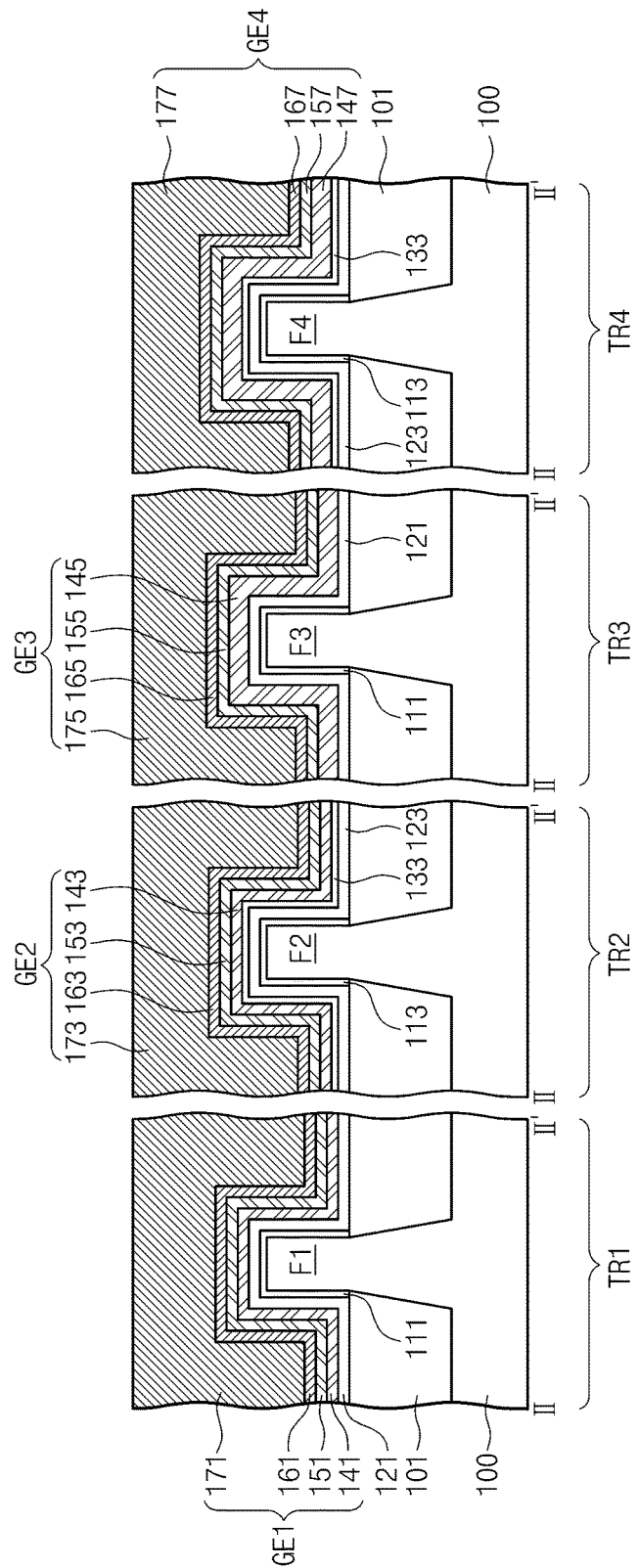

FIG. 6 is a perspective view illustrating a semiconductor device according to still other example embodiments of the inventive concepts. FIGS. 7 and 8 are sectional views taken along lines I-I' and II-II' of FIG. 6, to illustrate a semiconductor device according to still other example embodiments of the inventive concepts. For concise description, an element previously described with reference to FIG. 5 may be identified by a similar or identical reference number without repeating an overlapping description thereof.

Referring to FIGS. 6, 7, and 8, a semiconductor device may include first to fourth transistors TR1, TR2, TR3, and TR4. The first to fourth transistors TR1, TR2, TR3, and TR4 may have a common conductivity type and may have different threshold voltages from each other. For example, the first transistor TR1 may have a first threshold voltage, and the second transistor TR2 may have a second threshold voltage lower than the first threshold voltage. The third transistor TR3 may have a third threshold voltage higher than that of the first threshold voltage, and the fourth transistor TR4 may have a fourth threshold voltage, which is higher than that of the first threshold voltage and is lower than that of the third threshold voltage.

The first to fourth transistors TR1, TR2, TR3, and TR4 may include first to fourth gate structures GS1, GS2, GS3, and GS4, respectively, and each of them may have source/drain electrodes 103. In some example embodiments, the first to fourth gate structures GS1, GS2, GS3, and GS4 may be provided to cross first to fourth fin patterns F1, F2, F3, and F4, respectively. The cross first to fourth fin patterns F1, F2, F3, and F4 may protrude vertically from the semiconductor substrate 100. In some example embodiments, each of the first to fourth fin patterns F1, F2, F3, and F4 may be a portion of the semiconductor substrate 100 or an epitaxial pattern grown from the semiconductor substrate 100. The device isolation layer 101 may be provided at both sides of each of the first to fourth fin patterns F1, F2, F3, and F4, and the top surface of the device isolation layer 101 may be positioned below those of the first to fourth fin patterns F1, F2, F3, and F4. In some example embodiments, the first to fourth fin patterns F1, F2, F3, and F4 may have top surfaces that are substantially coplanar with each other.

The source/drain electrodes 103 may be provided on each of the first to fourth fin patterns F1, F2, F3, and F4 and at both sides of each of the first to fourth gate structures GS1, GS2, GS3, and GS4. In some example embodiments, the source/drain electrodes 103 may be formed of an epitaxial layer. In some example embodiments, where the first to fourth transistors TR1, TR2, TR3, and TR4 are of n-type, the source/drain electrodes 103 may be formed of at least one of materials exerting tensile strain to channel regions of the first to fourth transistors TR1, TR2, TR3, and TR4. For example, the source/drain electrodes 103 may be formed of silicon carbide (SiC). In some example embodiments, where the first to fourth transistors TR1, TR2, TR3, and TR4 are of p-type, the source/drain electrodes 103 may be formed of at least one of materials exerting compressive strain to the channel regions of the first to fourth transistors TR2, TR2, TR3, and TR4. For example, the source/drain electrodes 103 may be formed of silicon germanium (SiGe).

Each of the first to fourth gate structures GS1, GS2, GS3, and GS4 may have substantially the same stack structure as previously described with reference to FIG. 5. In other words, the first gate structure GS1 may include a first gate electrode GE1 and a first interface layer 111 and a first high-k dielectric layer 121, which are interposed between the first gate electrode GE1 and the first active region ACT1. The second gate structure GS2 may include a second gate electrode GE2 and a second interface layer 113, a second high-k dielectric layer 123, and a third high-k dielectric layer 133, which are stacked between the second gate electrode GE2 and the second active region ACT2. The third gate structure GS3 may include a third gate electrode GE3 and the first interface layer 111 and the first high-k dielectric layer 121, which are stacked between the third gate electrode GE3 and the third active region ACT3. The fourth gate structure GS4 may include a fourth gate electrode GE4 and the second interface layer 113, the second high-k dielectric layer 123, and the third high-k dielectric layer 133, which are stacked between the fourth gate electrode GE4 and the fourth active region ACT4. The first high-k dielectric layers 121 of the first and third gate structures GS1 and GS3 may include a first work-function adjusting material. The second and third high-k dielectric layers 123 and 133 of the second and fourth gate structures GS2 and GS4 may include a second work-function adjusting material.

In some example embodiments, spacers 180 may be provided on both sidewalls of each of the first to fourth gate structures GS1, GS2, GS3, and GS4. The first high-k dielectric layer 121 of the first gate structure GS1 may be extended to have portions interposed between the first gate electrode GE1 and the first interface layer 111 and between the first gate electrode GE1 and the spacers 180. Similarly, the first high-k dielectric layer 121 of the third gate structure GS3 may be extended to have portions interposed between the third gate electrode GE3 and the first interface layer 111 and between the third gate electrode GE3 and the spacers 180.

The second and third high-k dielectric layers 123 and 133 of the second gate structure GS2 may be extended to have portions interposed between the second gate electrode GE2 and the second interface layer 113 and between the second gate electrode GE2 and the spacers 180. Similarly, the second and third high-k dielectric layers 123 and 133 of the fourth gate structure GS4 may be extended to have portions interposed between the fourth gate electrode GE4 and the second interface layer 113 and between the fourth gate electrode GE4 and the spacers 180.

As shown in the illustrated example embodiments, each of the first to fourth gate electrodes GE1, GE2, GE3, and GE4 may include a separate blocking layer 141, 143, 145, or 147, a separate work-function conductive layer 151, 153, 155, or 157, a separate barrier metal layer 161, 163, 165, or 167, and a separate metal layer 171, 173, 175, or 177, which are sequentially stacked on the substrate. In some example embodiments, the blocking layer 141, 143, 145, or 147, the work-function conductive layer 151, 153, 155, or 157, and the barrier metal layer 161, 163, 165 or 167 may have a substantially 'U'-shaped section, and the metal layer 171, 173, 175, or 177 may fill a gap region that is positioned between the spacers 180 and is defined by the barrier metal layer 161, 163, 165, or 167.

Figure 9:
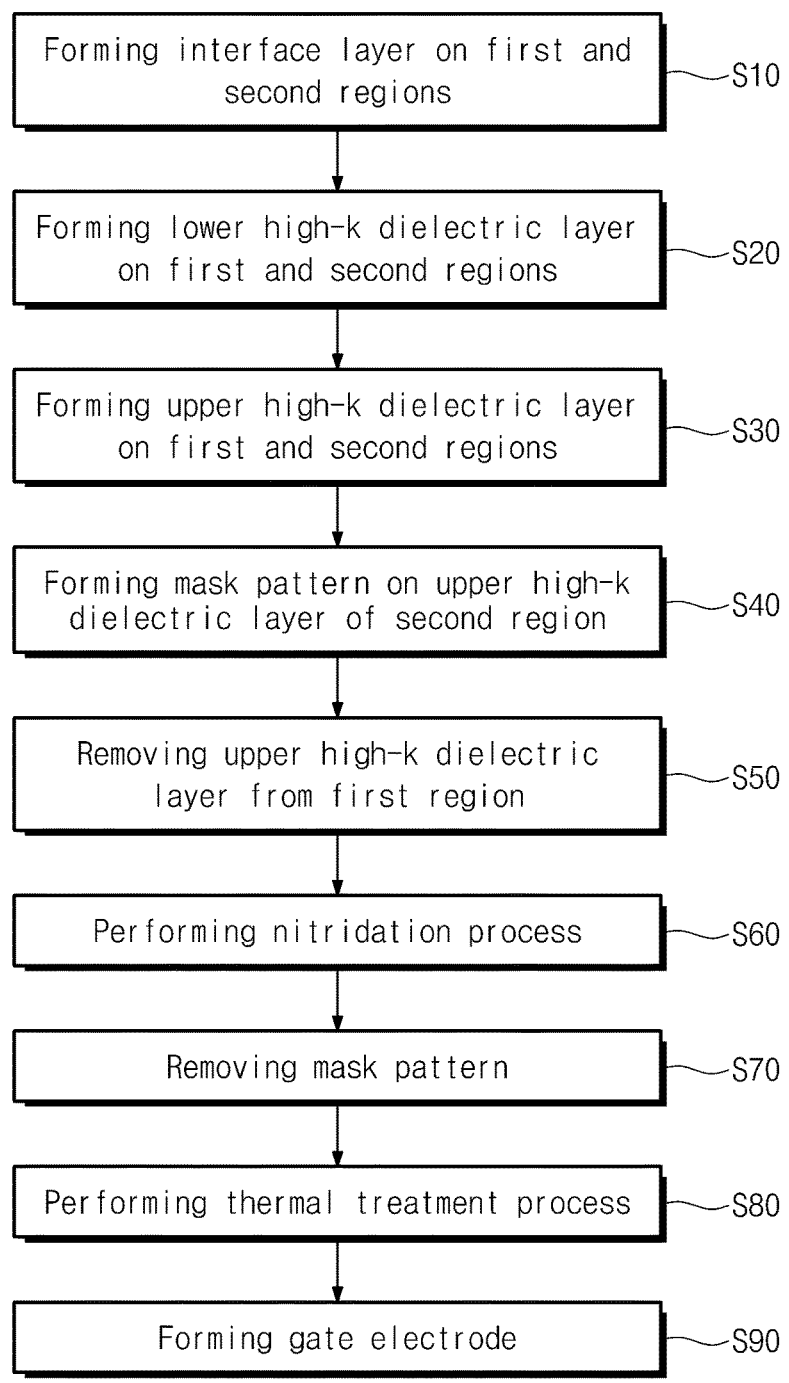
FIG. 9 is a flow chart illustrating a method of fabricating a semiconductor device, according to some example embodiments of the inventive concepts.

FIG. 9 is a flow chart illustrating a method of fabricating a semiconductor device, according to some example embodiments of the inventive concepts. FIGS. 10A, 10B, 10C, 10D, 10E, 10F, and 10G are sectional views illustrating a method of fabricating a semiconductor device, according to some example embodiments of the inventive concepts.

Figure 10A:
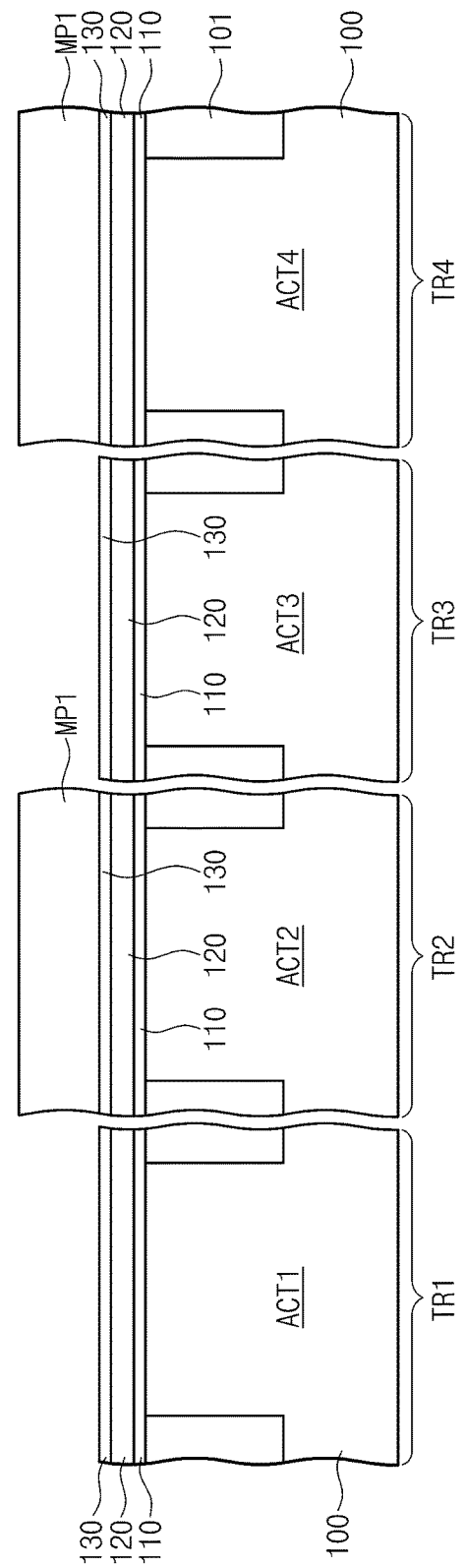

Referring to FIGS. 9 and 10A, the device isolation layer 101 may be formed on the semiconductor substrate 100 to define the first active region ACT1, the second active region ACT2, the third active region ACT3, and the fourth active region ACT4.

In some example embodiments, the semiconductor substrate 100 may be a single crystalline silicon wafer, but in other embodiments, the semiconductor substrate 100 may be a silicon-on-insulator (SOI) wafer, a germanium wafer, a germanium-on-insulator (GOI) wafer, a silicon-germanium wafer, or a substrate including an epitaxial layer. The semiconductor substrate 100 may include an n- or p-type well impurity layer, and in some example embodiments, the first to fourth active regions ACT1, ACT2, ACT3, and ACT4 may have the same conductivity type.

The formation of the device isolation layer 101 may include patterning the semiconductor substrate 100 to form trenches, depositing an insulating layer to fill the trenches, and then, planarizing the insulating layer to expose the top surface of the semiconductor substrate 100.

In some example embodiments, the first to fourth active regions ACT1, ACT2, ACT3, and ACT4 may include fin patterns protruding from the semiconductor substrate 100, as described with reference to FIGS. 6, 7, and 8. Here, the fin patterns of the first to fourth active regions ACT1, ACT2, ACT3, and ACT4 may have the same conductivity type.

Referring to FIGS. 9 and 10A, an interface layer 110, a lower high-k dielectric layer 120, and an upper high-k dielectric layer 130 may be sequentially formed on the semiconductor substrate 100 including the first to fourth active regions ACT1, ACT2, ACT3, and ACT4 (in S10, S20, and S30).

In the case where the first to fourth active regions ACT1, ACT2, ACT3, and ACT4 include fin patterns, the interface layer 110, the lower high-k dielectric layer 120, and the upper high-k dielectric layer 130 may be formed to sequentially and conformally cover the fin patterns.

The interface layer 110 may be formed of a dielectric material, whose dielectric constant is less than 9. For example, the interface layer 110 may be a silicon oxide layer or a silicon oxynitride layer. The interface layer 110 may be formed by a thermal oxidation process or an atomic layer deposition process. The interface layer 110 may contribute to improve an interface property between the semiconductor substrate 100 and the lower high-k dielectric layer 120, and this may make it possible to improve electric characteristics electron mobility) of the transistors.

The lower high-k dielectric layer 120 may be formed of a high-k dielectric material, whose dielectric constant is higher than that of silicon oxide, and may be thicker than the interface layer 110. For example, the lower high-k dielectric layer 120 may be formed of or include at least one of metal oxides, metal silicates, or metal silicate nitrides. The metal oxides may include oxide materials containing metallic elements (e.g., hafnium (Hf), aluminum (Al), lanthanum (La), and zirconium (Zr)). For example, the metal oxides may include at least one of hafnium oxide, aluminum oxide, lanthanum oxide, and zirconium oxide. For example, the metal oxide may include at least one of $HfO_2$, $Al_2O_3$, $La_2O_3$, and $ZrO_2$. The metal silicates may include silicate materials containing metallic elements (e.g., hafnium (Hf) or zirconium (Zr)). For example, the metal silicates may include at least one of hafnium silicate (HfSiO) and zirconium silicate (ZrSiO). The metal silicate nitrides may include silicate materials containing metallic elements (e.g., hafnium (Hf), zirconium (Zr)). For example, the metal silicate nitrides may include at least one of hafnium silicate nitride (HfSiON) and zirconium silicate nitride (ZrSiON).

The lower high-k dielectric layer 120 may be formed by, for example, one of chemical vapor deposition (CVD), low-pressure CVD (LPCVD), plasma-enhanced CVD (PECVD), metal-organic CVD (MOCVD), atomic layer deposition (ALD), and plasma-enhanced ALD (PEALD) processes. In some example embodiments, the ALD or PEALD process may be used to improve uniformity of the lower high-k dielectric layer 120.

In some example embodiments, the lower high-k dielectric layer 120 may be formed on multiple active regions ACT1, ACT2, ACT3, ACT4 such that a first portion of the lower high-k dielectric layer 120 is on the first active region ACT1, a second portion of the lower high-k dielectric layer 120 is on the second active region ACT2, a third portion of the lower high-k dielectric layer 120 is on the third active region ACT3, and a fourth portion of the lower high-k dielectric layer 120 is on the fourth active region ACT4.

The upper high-k dielectric layer 130 may be formed of a high-k dielectric material and may contain a first work-function adjusting material. In some example embodiments, the first work-function adjusting material may be a metallic material, whose electron affinity is greater than the metallic material contained in the lower high-k dielectric layer 120. For example, the first work-function adjusting material may include at least one of Al, Mg, Ca, Sr, V, Nb, Sc, Y, and lanthanoid materials. In some example embodiments, the first to fourth transistors TR1, TR2, TR3, and TR4 are of n-type, the upper high-k dielectric layer 130 may be lanthanum oxide. In some example embodiments, where the first to fourth transistors TR1, TR2, TR3, and TR4 are of p-type, the upper high-k dielectric layer 130 may be aluminum oxide.

The upper high-k dielectric layer 130 may be formed to be in direct contact with the top surface of the lower high-k dielectric layer 120 and may be thinner than the lower high-k dielectric layer 120. The upper high-k dielectric layer 130 may be formed by a chemical vapor deposition process or an atomic layer deposition process.

Referring to FIGS. 9 and 10A, a first mask pattern MP1 may be formed on the second and fourth active regions ACT2 and ACT4 to cover the upper high-k dielectric layer 130 (in S40). In other words, the first mask pattern MP1 may be formed to expose the upper high-k dielectric layer 130 of the first and third active regions ACT1 and ACT3.

Figure 10B:
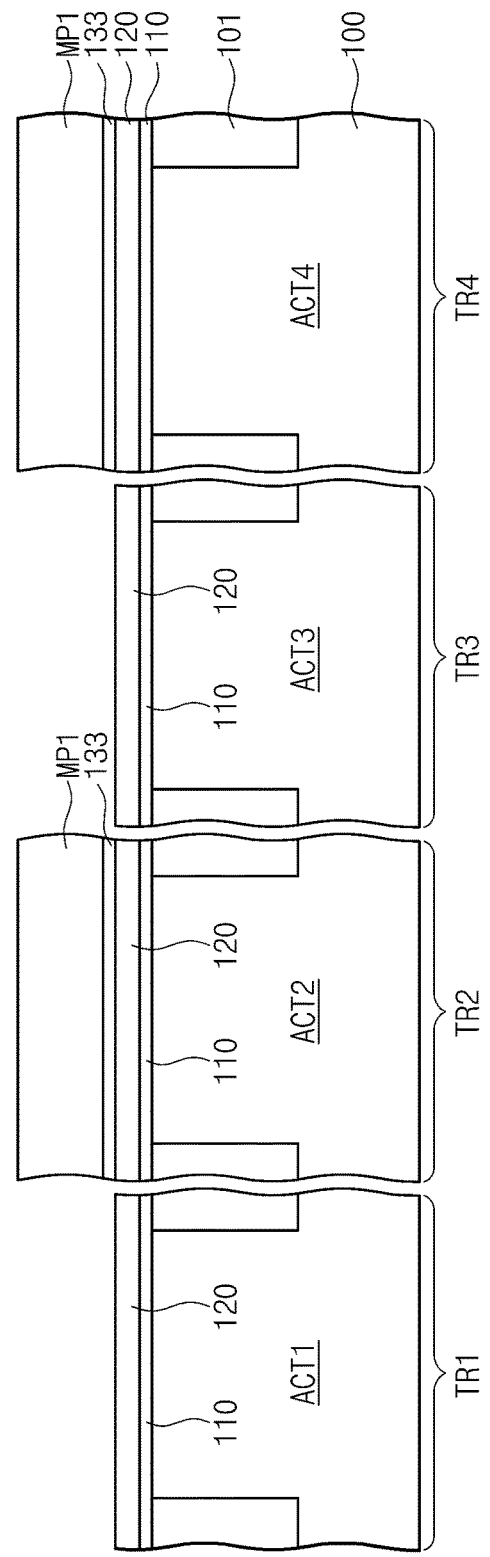

Referring to FIGS. 9 and 10B, the upper high-k dielectric layer 130 of the first and third active regions ACT1 and ACT3 may be etched using the first mask pattern MP1 as an etch mask (in S50). Accordingly, the third high-k dielectric layer 133 may be formed on each of the second and fourth active regions ACT2 and ACT4, and the upper high-k dielectric layer 130 may be removed from the first and third active regions ACT1 and ACT3 to expose the lower high-k dielectric layer 120.

Figure 10C:
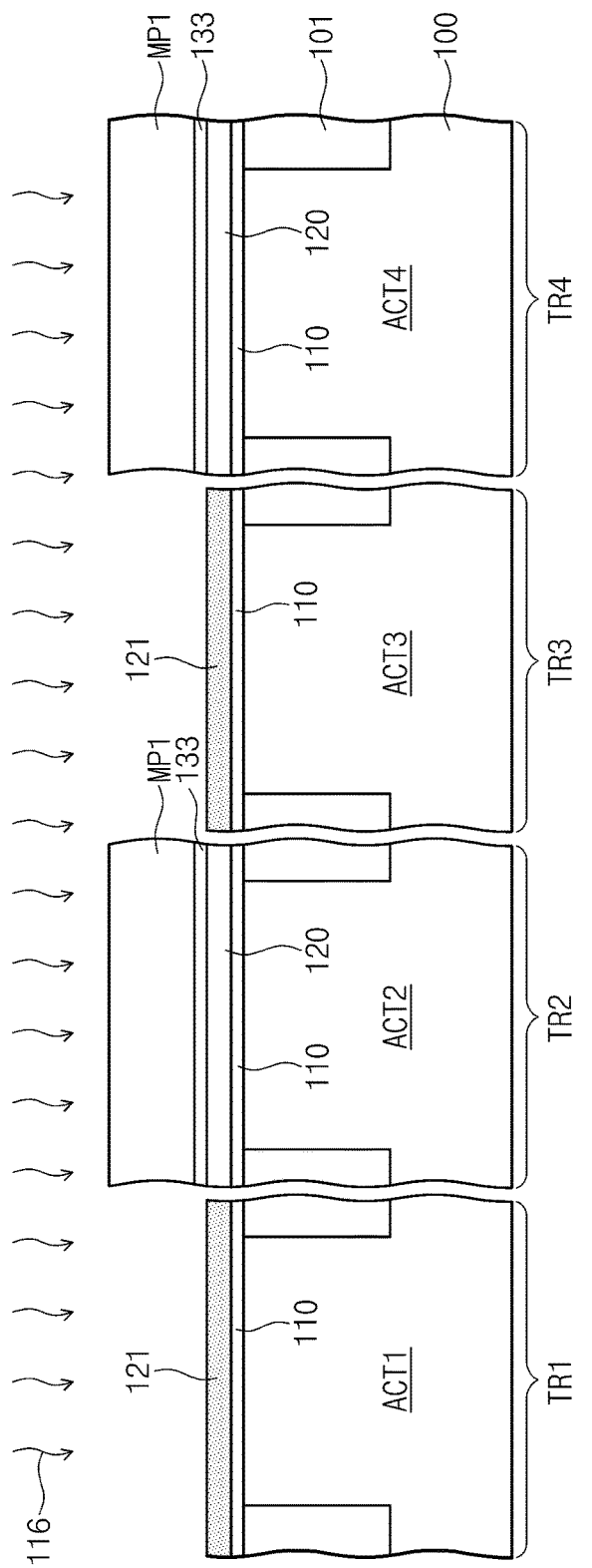

Referring to FIGS. 9 and 10C, a process 116 may be perform to inject the second work-function adjusting material into the lower high-k dielectric layer 120 of the first and third active regions ACT1 and ACT3 (S60). As a result, the first high-k dielectric layer 121 containing the second work-function adjusting material may be formed on the first and third active regions ACT1 and ACT3. In some example embodiments, the second work-function adjusting material may be a nonmetallic material, whose electronegativity is higher than that of the first work-function adjusting material contained in the upper high-k dielectric layer 130. For example, the second work-function adjusting material may include nitrogen (N), fluorine (F), or carbon (C).

In some example embodiments, a nitridation process 116 may be performed to selectively dope the lower high-k dielectric layer 120 of the first and third active regions ACT1 and ACT3 with nitrogen serving as the second work-function adjusting material. The nitridation process 116 may be performed using, for example, at least one of thermal nitridation, plasma treatment, plasma ion doping, pulsed plasma ion doping, and ion implantation processes.

As a result of the nitridation process 116, the lower high-k dielectric layer 120 of the first and third active regions ACT1 and ACT3, also referred to as the first and third portions of the lower high-k dielectric layer 120, may be doped with nitrogen. Furthermore, by controlling process conditions of the nitridation process 116, the lower high-k dielectric layer 120 of the first and third active regions ACT1 and ACT3 may have a nitrogen concentration decreasing in a direction from a top surface to a bottom surface of the lower high-k dielectric layer 120 (i.e., in a direction through the lower high-k dielectric layer towards the substrate 100). In some example embodiments, the nitrogen concentration of the lower high-k dielectric layer 120 may be substantially uniform. Furthermore, by controlling the process conditions of the nitridation process 116, nitrogen may be injected to the interface layer 110. In some example embodiments, a nitrogen concentration of the interface layer 110 on the first and third active regions ACT1 and ACT3 may be higher than that of the interface layer 110 on the second and fourth active regions ACT2 and ACT4.

In some example embodiments, where the lower high-k dielectric layer 120 is formed of hafnium oxide or hafnium silicate, the lower high-k dielectric layer 120 of the first and third active regions ACT1 and ACT3 may be changed to a hafnium oxynitride layer or a hafnium silicate nitride layer, after the nitridation process 116.

Since, during the injection process of the second work-function adjusting material, the second and fourth active regions ACT2 and ACT4 are covered with the first mask pattern MP1, it is possible to prevent nitrogen from being injected into the lower high-k dielectric layer 120 and the upper high-k dielectric layer 130 of the second and fourth active regions ACT2 and ACT4.

Referring to FIG. 9, after the nitridation process 116, the first mask pattern MP1 may be removed from the second and fourth active regions ACT2 and ACT4 (in S70).

Referring to FIGS. 9 and 10D, the third high-k dielectric layer 133 may be exposed on the second and fourth active regions ACT2 and ACT4, and a thermal treatment process 118 may be performed on the resulting structure (in S80). As a result of the thermal treatment process 118, the first work-function adjusting material (e.g., lanthanum or aluminum) in the third high-k dielectric layer 133 may be diffused into the lower high-k dielectric layer 120. Accordingly, the second high-k dielectric layer 123 containing the first work-function adjusting material may be formed on the second and fourth active regions ACT2 and ACT4.

Owing to the diffusion of the first work-function adjusting material into the second high-k dielectric layer 123, dipoles 114 may be formed at the interface between the interface layer 110 and the second high-k dielectric layer 123. The presence of the dipoles 114 may lead to a change in effective work-function and consequently threshold voltage of the transistor. In other words, threshold voltages of transistors to be formed on the second and fourth active regions ACT2 and ACT4 may be controlled by a concentration of the first work-function adjusting material contained in the second high-k dielectric layer 123.

The concentration of the first work-function adjusting material contained in the second high-k dielectric layer 124 may be controlled by adjusting process conditions of the thermal treatment process 118. The concentration of the first work-function adjusting material contained in the second high-k dielectric layer 123 may be smaller than that of the first work-function adjusting material contained in the third high-k dielectric layer 133. In addition, the concentration of the first work-function adjusting material contained in the second high-k dielectric layer 123 may decrease in a direction from a top surface to a bottom surface of the second high-k dielectric layer 123.

Referring to FIGS. 9 and 10E, 10F, and 10G, gate electrodes may be formed on the first to fourth active regions ACT1, ACT2, ACT3, and ACT4 (in S90).

Figure 10E:
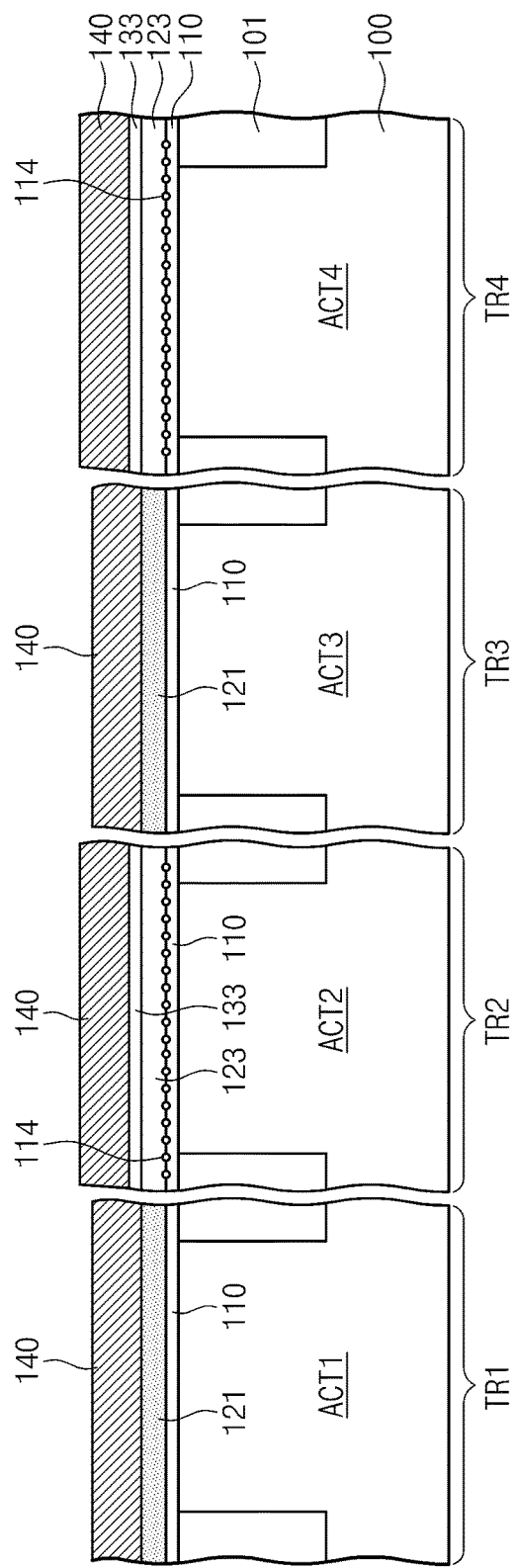

In detail, referring to FIG. 10E, a blocking layer 140 may be formed on the first to fourth active regions ACT1, ACT2, ACT3, and ACT4. The blocking layer 140 may be formed on the first high-k dielectric layer 121 of the first and third active regions ACT1 and ACT3 and on the second high-k dielectric layer 123 of the second and fourth active regions ACT2 and ACT4. The blocking layer 140 on the first to fourth active regions ACT1, ACT2, ACT3, and ACT4 may have substantially the same thickness.

In some example embodiments, the blocking layer 140 may be formed of or include at least one of titanium, tantalum, titanium nitride, tantalum nitride, titanium silicide, tantalum silicide, titanium carbide, tantalum carbide, titanium silicon nitride, tantalum silicon nitride, titanium silicon carbide, or tantalum silicon carbide. For example, the blocking layer 140 may be formed of a titanium nitride (TiN) layer or a tantalum nitride (TaN) layer.

Figure 10F:
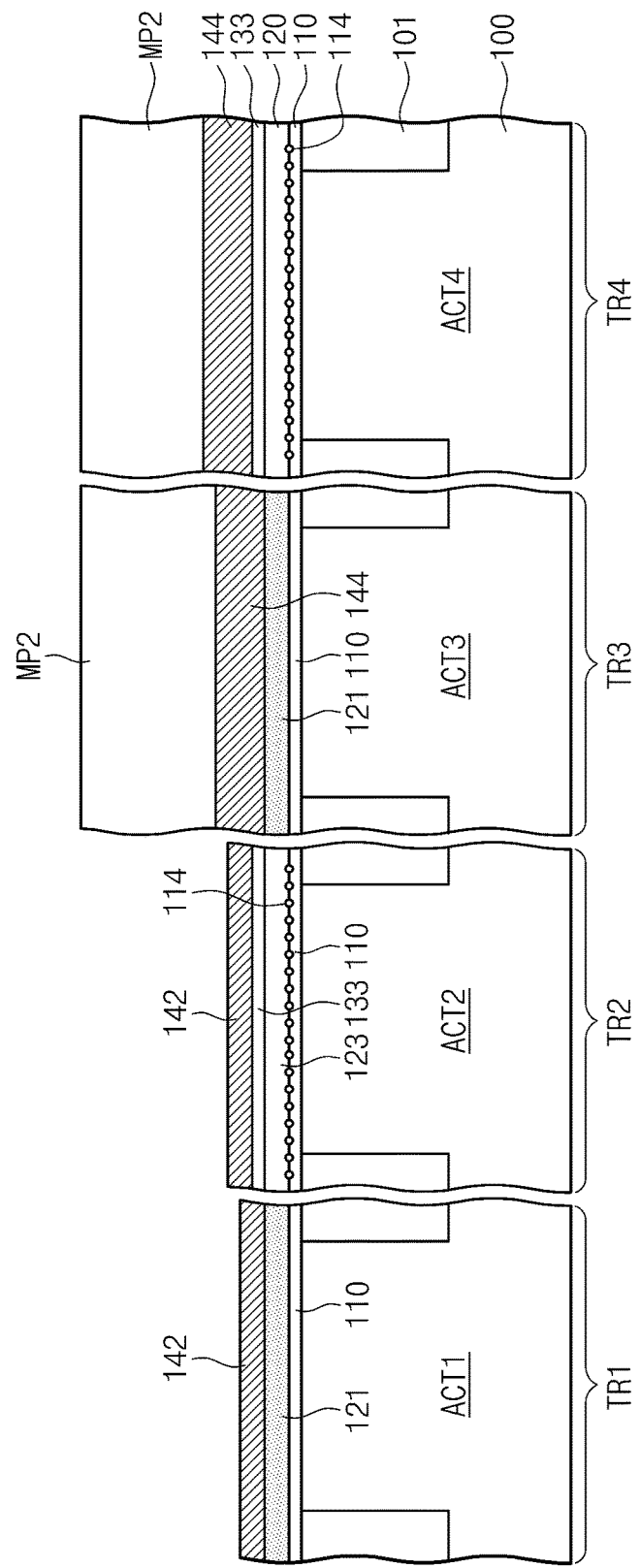

Referring to FIGS. 9 and 10F, a second mask pattern MP2 may be formed on the third and fourth active regions ACT3 and ACT4 to cover the blocking layer 140. Thereafter, an etching process using the second mask pattern MP2 as an etch mask may be performed to reduce the thickness of the blocking layer 140 on the first and second active regions ACT1 and ACT2.

Accordingly, a first blocking layer 142 may be formed on the first and second active regions ACT1 and ACT2 to have the first thickness, and a second blocking layer 144 may be formed on the third and fourth active regions. ACT3 and ACT4 to have a second thickness greater than the first thickness.

Figure 10G:
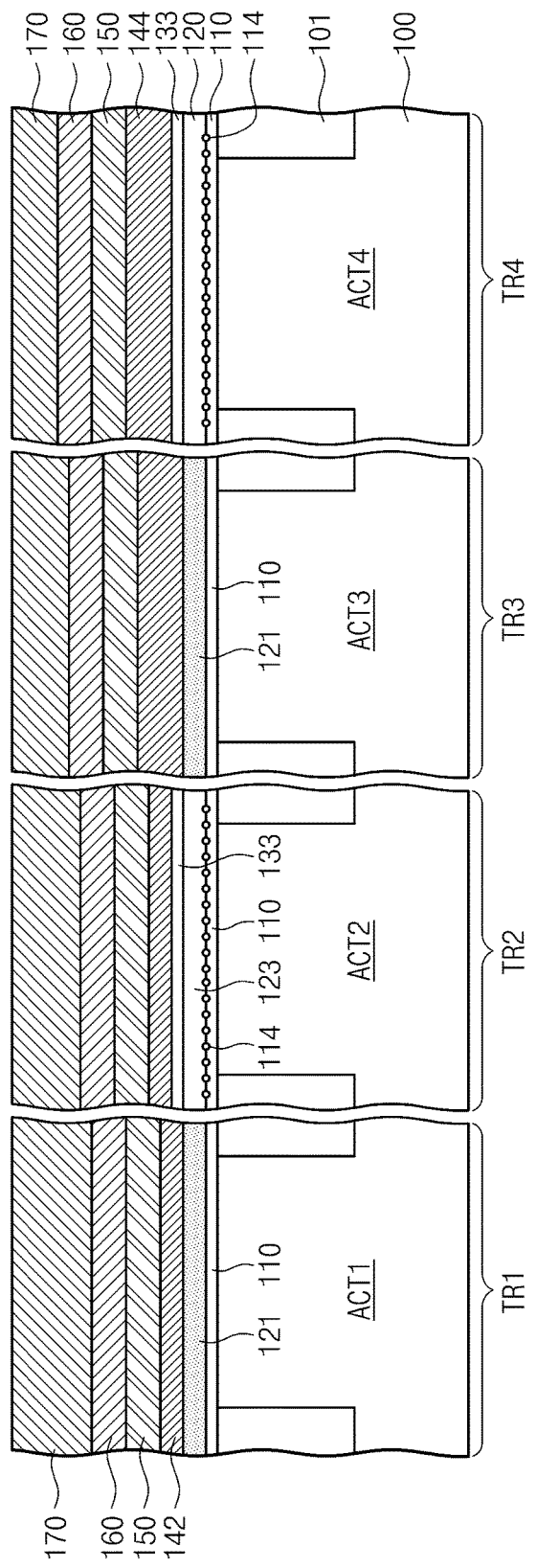

Referring to FIGS. 9 and 10G, a gate electrode layer may be formed on the first to fourth active regions ACT2, ACT2, ACT3, and ACT4. The gate electrode layer may include a work-function conductive layer 150, a barrier metal layer 160, and a metal layer 170. In some example embodiments, the work-function conductive layer 150 and the barrier metal layer 160 may be formed to have a substantially uniform thickness on the first to fourth active regions ACT1, ACT2, ACT3, and ACT4. The metal layer 170 may be formed to have a difference in thickness between the first to fourth active regions ACT1, ACT2, ACT3, and ACT4. In some example embodiments, each of the work-function conductive layer 150, the barrier metal layer 160, and the metal layer 170 may be formed to have a substantially uniform thickness on the first to fourth active regions ACT1, ACT2, ACT3, and ACT4.

The work function conductive layer 150 may be formed of a conductive material having a specific work function. The use of the work-function conductive layer 150 may make it possible to adjust threshold voltages of transistors thereunder. For example, in the case where n-type transistors are formed on the first to fourth active regions ACT1, ACT2, ACT3, and ACT4, the work-function conductive layer 150 may be formed of a metallic material whose work function ranges from about 3.9 eV to about 4.4 eV. By contrast, in the case where p-type transistors are formed on the first to fourth active regions ACT1, ACT2, ACT3, and ACT4, the work-function conductive layer 150 may be formed of a metallic material whose work function ranges from about 4.7 eV to about 5.20 eV.

In some example embodiments, the work-function conductive layer 150 may be formed of at least one of metal nitride materials, such as titanium nitride, tantalum nitride, tungsten nitride, hafnium nitride, and zirconium nitride. In some example embodiments, the work-function conductive layer 150 may be formed of an aluminum-containing conductive material. For example, the work-function conductive layer 150 may be formed of at least one of metal aluminide, metal aluminum carbide, metal aluminum nitride, or metal aluminum silicide.

The barrier metal layer 160 may be formed of at least one of metal nitride materials, such as titanium nitride, tantalum nitride, tungsten nitride, hafnium nitride, and zirconium nitride.

The metal layer 170 may be formed of at least one of metallic materials whose resistivity is lower than that of the barrier metal layer 160. For example, the metal layer 170 may be formed of one of tungsten, copper, hafnium, zirconium, titanium, tantalum, aluminum, ruthenium, palladium, platinum, cobalt, nickel, and conductive metal nitrides or combinations thereof.

Next, referring to FIG. 5, a patterning process may be performed to form the first to fourth gate structures GS1, GS2, GS3, and GS4 on the first to fourth active regions ACT1, ACT2, ACT3, and ACT4, respectively.

In some example embodiments, the upper high-k dielectric layer 130 may be omitted from the transistors TR1, TR2, TR3, and TR4. As a result, the third high-k dielectric layer 133 may be omitted from transistors TR2 and TR4. With reference to FIG. 9 and FIG. 10A, 10B, 10C, 10D, the steps S30 and S50 may be omitted. The mask pattern MP1 may be formed on the second and fourth portions of the lower high-k dielectric layer on the second and fourth active regions ACT2, ACT4. The nitridation process 116 may be performed (S60) to form the first high-k dielectric layers 121 on the first and third active regions ACT1, ACT3. The mask pattern MP1 may be removed (S70), and the thermal conditioning process 118 may be performed (S80) to form the second high-k dielectric layers 123 on the second and fourth active regions ACT2, ACT4. One or more gate electrodes may be formed (S90) on the high-k dielectric patterns.

Figure 11:
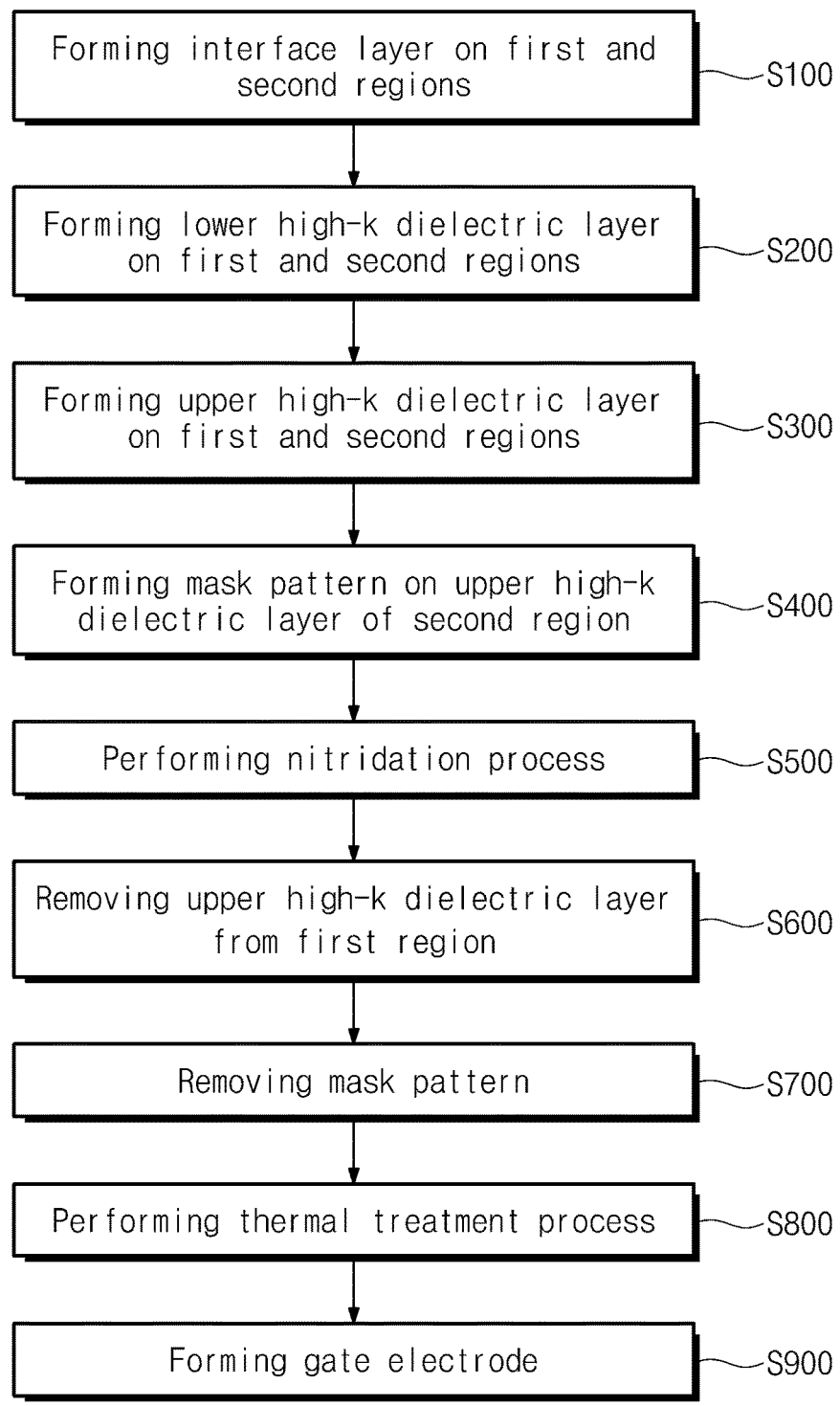
FIG. 11 is a flow chart illustrating a method of fabricating a semiconductor device, according to other example embodiments of the inventive concepts.
Figure 12A:
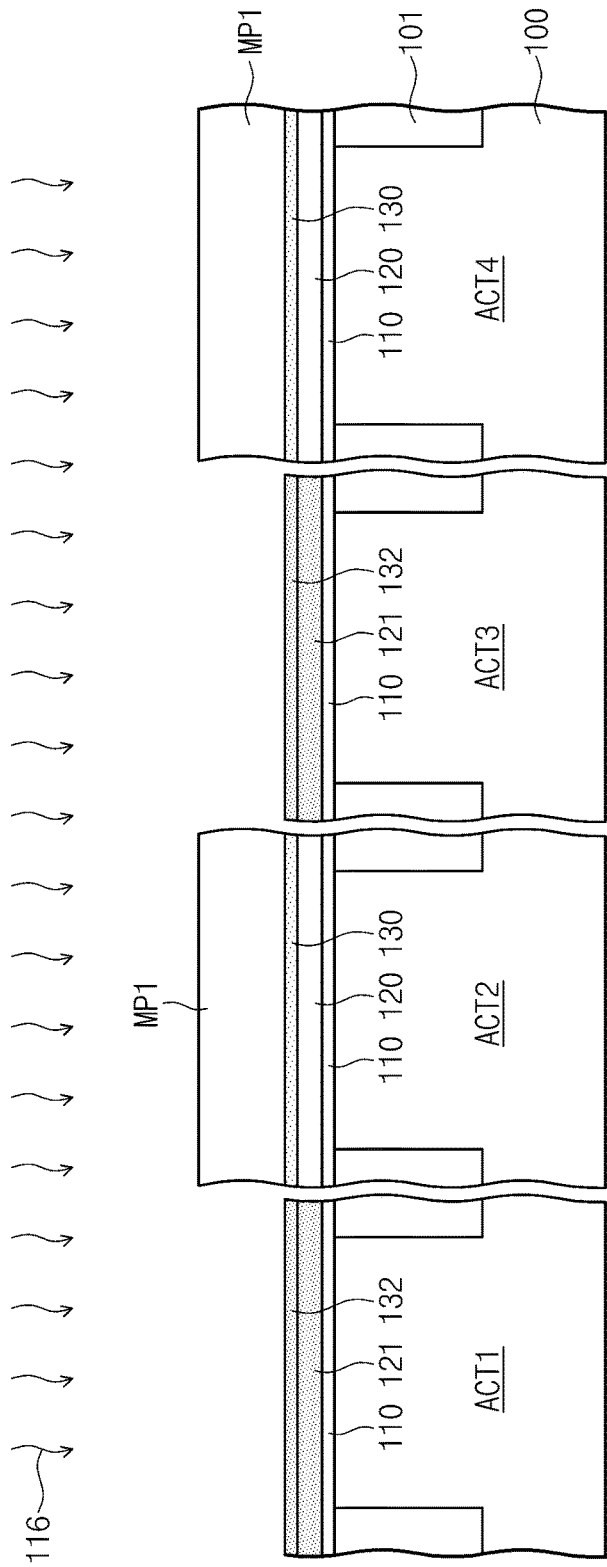
FIGS. 12A, 12B, and 12C are sectional views illustrating a method of fabricating a semiconductor device, according to other example embodiments of the inventive concepts.
Figure 12B:
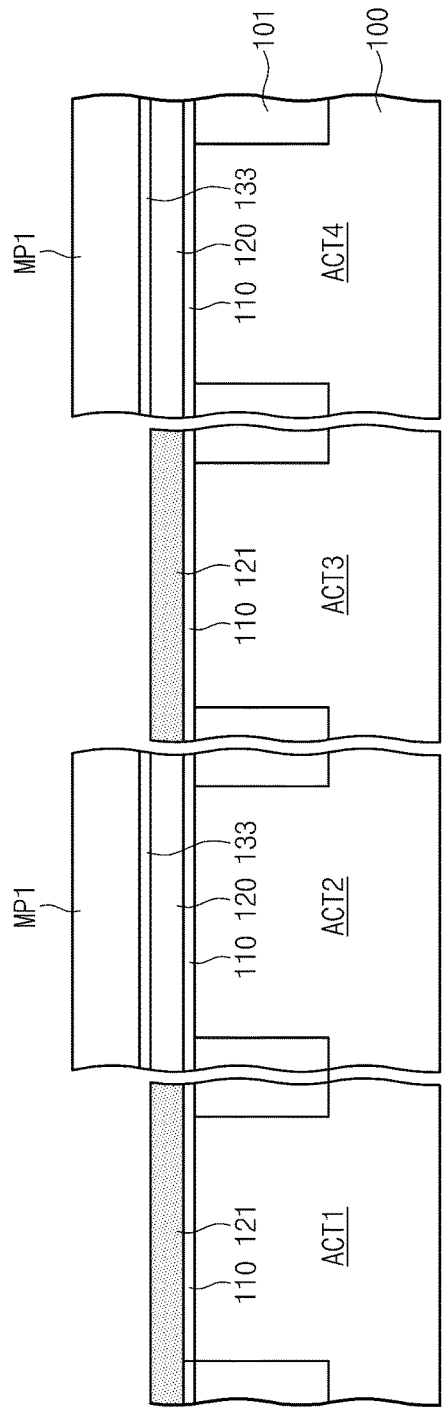
Figure 12C:
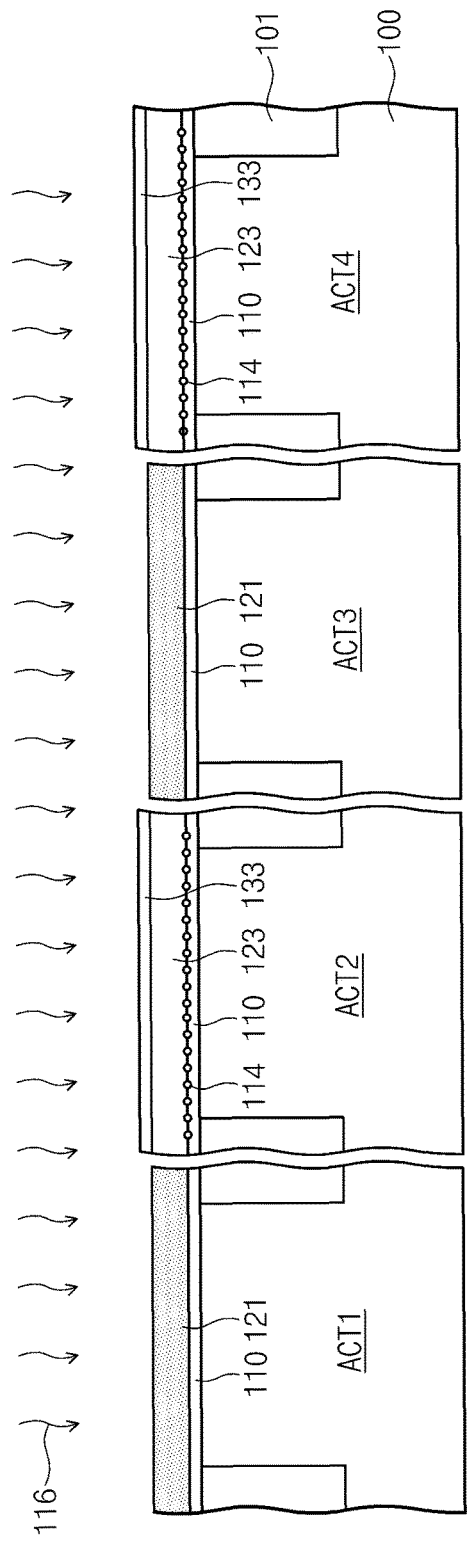

FIG. 11 is a flow chart illustrating a method of fabricating a semiconductor device, according to some example embodiments of the inventive concepts. FIGS. 12A, 12B, and 12C are sectional views illustrating a method of fabricating a semiconductor device, according to other example embodiments of the inventive concepts. For concise description, an element or step previously described with reference to FIG. 9 and FIGS. 10A through 10G may be identified by a similar or identical reference number without repeating an overlapping description thereof.

Referring to FIGS. 1 and 12A, the interface layer 110, the lower high-k dielectric layer 120, and the upper high-k dielectric layer 130 may be sequentially formed on the semiconductor substrate 100 with the first to fourth active regions ACT1, ACT2, ACT3, and ACT4 (in S100, S200, and S300). As described with reference to FIG. 10A, the upper high-k dielectric layer 130 may contain the first work-function adjusting material.

Referring to FIGS. 11 and 12A, a first mask pattern MP1 may be formed on the second and fourth active regions ACT2 and ACT4 to cover the upper high-k dielectric layer 130 (in S400). The first mask pattern MP1 may be formed to expose the upper high-k dielectric layer 130 on the first and third active regions ACT1 and ACT3.

As described with reference to FIG. 10C, a process 116 may be performed to inject a second work-function adjusting material into the lower high-k dielectric layer 120 of the first and third active regions ACT1 and ACT3 (in S500). As a result, the first high-k dielectric layer 121 containing the second work-function adjusting material may be formed on the first and third active regions ACT1 and ACT3. As described above, a nitridation process 116 may be performed to dope the lower high-k dielectric layer 120 of the first and third active regions ACT1 and ACT3 with nitrogen serving as the second work-function adjusting material. According to the present embodiment, the upper high-k dielectric layer 130 of the first and third active regions ACT1 and ACT3 may be exposed during the nitridation process 116, an upper high-k dielectric layer 132 doped with the second work-function adjusting material (i.e., nitrogen) may be formed on the first and third active regions ACT1 and ACT3.

Referring to FIGS. 11 and 12B, the upper high-k dielectric layer 132 of the first and third active regions ACT1 and ACT3 may be etched using the first mask pattern MP1 as an etch mask (S600). In other words, the upper high-k dielectric layer 132 doped with nitrogen may be removed from the first and third active regions ACT1 and ACT3. Accordingly, the third high-k dielectric layer 133 may be formed on each of the second and fourth active regions ACT2 and ACT4, and the first high-k dielectric layer 121 may be exposed on the first and third active regions ACT1 and ACT3.

Referring to FIGS. 11 and 12C, the first mask pattern MP1 may be removed, after the formation of the third high-k dielectric layer 133 (in S700).

Thereafter, the third high-k dielectric layer 133 of the second and fourth active regions ACT2 and ACT4 may be exposed, and a thermal treatment process 118 may be performed on the resulting structure (in S800). As a result of the thermal treatment process 118, the first work-function adjusting material (e.g., lanthanum or aluminum) contained in the third high-k dielectric layer 133 may be diffused into the lower high-k dielectric layer 120 of the second and fourth active regions ACT2 and ACT4. Accordingly, the second high-k dielectric layer 123 containing the first work-function adjusting material may be formed on the second and fourth active regions ACT2 and ACT4.

Referring to FIG. 11, gate electrodes may be formed on the first to fourth active regions ACT1, ACT2, ACT3, and ACT4 (in S900). As described with reference to FIGS. 10D through 10G, the formation of the gate electrodes may include sequentially forming a blocking layer, a work-function conductive layer, a barrier metal layer, and a metal layer on the first to fourth active regions ACT1, ACT2, ACT3, and ACT4, and then, patterning such layers to form the first to fourth gate structures GS1, GS2, GS3, and GS4 on the first to fourth active regions ACT1, ACT2, ACT3, and ACT4, respectively, as shown in FIG. 5.

A semiconductor device may include a plurality of field effect transistors with multiple threshold voltages. According to some example embodiments of the inventive concepts, it is possible to prevent deterioration in electric characteristics of the field effect transistor, which may result from an increase in concentration of a work-function adjusting material, and to realize a difference in threshold voltage between the field effect transistors.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a semiconductor substrate including a first active region, a second active region, and a third active region;
a first gate electrode on the first active region, a second gate electrode on the second active region, and a third gate electrode provided on the third active region;
a separate first high-k dielectric layer between each of the first and third gate electrodes and the semiconductor substrate; and
second and third high-k dielectric layers between the second gate electrode and the semiconductor substrate;
wherein each separate first high-k dielectric layer includes a first work-function adjusting material, and the second and third high-k dielectric layers include a second work-function adjusting material, the first gate electrode and the second gate electrode have substantially common effective work-functions, and the third gate electrode and the second gate electrode have different effective work-functions.

2. The device of claim 1, wherein the first active region, the second active region, and the third active region each have a common conductivity type.

3. The device of claim 1, wherein a concentration of the first work-function adjusting material in each separate first high-k dielectric layer is smaller than a concentration of the second work-function adjusting material in the second high-k dielectric layer.

4. The device of claim 1, wherein a concentration of the second work-function adjusting material in the third high-k dielectric layer is greater than a concentration of the second work-function adjusting material in the second high-k dielectric layer.

5. The device of claim 1, wherein the first work-function adjusting material is a nonmetallic material, and the second work-function adjusting material is a metallic material.

6. The device of claim 5, wherein
the first and second high-k dielectric layers include a common metallic material; and
the first and second high-k dielectric layers have different electron affinities from the second work-function adjusting material.

7. The device of claim 1, further comprising:
a first interface layer between each separate first high-k dielectric layer and the semiconductor substrate; and
a second interface layer between the second high-k dielectric layer and the semiconductor substrate;
wherein the first interface layer includes the first work-function adjusting material.

8. The device of claim 7, wherein a concentration of the first work-function adjusting material included in the first interface layer is lower than a concentration of the first work-function adjusting material included in each separate first high-k dielectric layer.

9. A semiconductor device, comprising:
a semiconductor substrate including at least a first active region and a second active region, the first and second active regions having a common conductivity type;
a first gate electrode on the first active region;
a first high-k dielectric layer between the first gate electrode and the semiconductor substrate, the first high-k dielectric layer including a first work-function adjusting material;
a second gate electrode on the second active region;
a second high-k dielectric layer between the second gate electrode and the semiconductor substrate, the second high-k dielectric layer including a second work-function adjusting material; and
a third high-k dielectric layer between the second gate electrode and the second high-k dielectric layer, the third high-k dielectric layer including the second work-function adjusting material.

10. The device of claim 9, wherein a concentration of the first work-function adjusting material in the first high-k dielectric layer is smaller than a concentration of the second work-function adjusting material in the second high-k dielectric layer.

11. The device of claim 9, wherein a concentration of the second work-function adjusting material in the third high-k dielectric layer is greater than a concentration of the second work-function adjusting material in the second high-k dielectric layer.

12. The device of claim 9, wherein the first and second high-k dielectric layers include a common metallic material.

13. The device of claim 9, wherein
the first work-function adjusting material is a nonmetallic material; and
the second work-function adjusting material is a metallic material.

14. The device of claim 9, wherein the first and second gate electrodes have substantially common effective work-functions.

15. The device of claim 9, wherein each gate electrode of the first and second gate electrodes includes a blocking layer and a work-function adjusting layer on the blocking layer; and the blocking layer of the first gate electrode is thinner than the blocking layer of the second gate electrode.

16. A semiconductor device, comprising:

a semiconductor substrate including at least a first active region and a second active region;

a first gate electrode on the first active region;

a first high-k dielectric layer between the first gate electrode and the semiconductor substrate, the first high-k dielectric layer including a first work-function adjusting material;

a second gate electrode on the second active region;

a second high-k dielectric layer between the second gate electrode and the semiconductor substrate, the second high-k dielectric layer including a second work-function adjusting material, the second work-function adjusting material different from the first work-function adjusting material; and a third high-k dielectric layer between the second gate electrode and the second high-k dielectric layer, the third high-k dielectric layer including the second work-function adjusting material that is different from the first work-function adjusting material.

17. The semiconductor device of claim 16, further comprising:

a first interface layer between the first high-k dielectric layer and the semiconductor substrate, the first interface layer including the first work-function adjusting material; and a second interface layer between the second high-k dielectric layer and the semiconductor substrate, the second interface layer including the second work-function adjusting material.

18. The semiconductor device of claim 17, wherein the second interface layer and the second high-k dielectric layer are configured to form dipoles at an interface between the second interface layer and the second high-k dielectric layer based on the second work-function adjusting material.

19. The semiconductor device of claim 16, wherein the first gate electrode and the second gate electrode have substantially common effective work-functions.

* * * * *